(12) United States Patent
Do et al.

(10) Patent No.: US 12,068,315 B2
(45) Date of Patent: Aug. 20, 2024

(54) SEMICONDUCTOR DEVICE

(71) Applicant: SAMSUNG ELECTRONICS CO., LTD., Suwon-si (KR)

(72) Inventors: Jungho Do, Hwaseong-si (KR); Sanghoon Baek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 600 days.

(21) Appl. No.: 17/323,707

(22) Filed: May 18, 2021

(65) Prior Publication Data
US 2022/0122970 A1 Apr. 21, 2022

(30) Foreign Application Priority Data
Oct. 15, 2020 (KR) .................. 10-2020-0133368

(51) Int. Cl.
| | |
|---|---|
| *H01L 27/06* | (2006.01) |
| *H01L 23/50* | (2006.01) |
| *H01L 23/522* | (2006.01) |
| *H01L 27/088* | (2006.01) |
| *H01L 29/66* | (2006.01) |
| *H01L 29/78* | (2006.01) |

(52) U.S. Cl.
CPC .......... *H01L 27/0886* (2013.01); *H01L 23/50* (2013.01); *H01L 23/5226* (2013.01); *H01L 27/0688* (2013.01); *H01L 29/6681* (2013.01); *H01L 29/785* (2013.01)

(58) Field of Classification Search
CPC . H01L 23/50; H01L 23/5226; H01L 27/0688; H01L 27/0886; H01L 29/6681; H01L 29/785

USPC .......................................................... 257/365
See application file for complete search history.

(56) References Cited

U.S. PATENT DOCUMENTS

| | | | |
|---|---|---|---|
| 6,308,307 B1 | 10/2001 | Cano et al. | |
| 6,492,244 B1 | 12/2002 | Christensen et al. | |
| 9,900,005 B2 | 2/2018 | Chen et al. | |
| 10,032,707 B2 | 7/2018 | Lai et al. | |
| 10,114,919 B2 | 10/2018 | Preuthen et al. | |
| 10,565,341 B2 | 2/2020 | Lin et al. | |
| 10,615,122 B2 | 4/2020 | Kishishita | |
| 2009/0026546 A1* | 1/2009 | Shimada ........... | H01L 27/11803 257/E27.06 |

(Continued)

*Primary Examiner* — Monica D Harrison
(74) *Attorney, Agent, or Firm* — Sughrue Mion, PLLC

(57) ABSTRACT

A semiconductor device is provided. The semiconductor device includes a substrate including a first dummy region and a second dummy region spaced apart from the first dummy region; a device isolation layer filling a trench between the first dummy region and the second dummy region; a first dummy electrode provided on the first dummy region; a second dummy electrode provided on the second dummy region; a power line extending from the first dummy region to the second dummy region, the power line including an expanded portion provided on the device isolation layer, a width of the expanded portion being larger than a line width of a remaining portion of the power line; a power delivery network provided on a bottom surface of the substrate; and a through via extending through the substrate and the device isolation layer, and electrically connecting the power delivery network to the expanded portion. The through via and the expanded portion vertically overlap.

10 Claims, 41 Drawing Sheets

(56) References Cited

U.S. PATENT DOCUMENTS

2020/0042668 A1 2/2020 Peng et al.
2020/0134128 A1 4/2020 Peng et al.

* cited by examiner

SEMICONDUCTOR DEVICE

CROSS-REFERENCE TO RELATED APPLICATION

This application claims priority to Korean Patent Application No. 10-2020-0133368, filed on Oct. 15, 2020 in the Korean Intellectual Property Office, the entire contents of which are hereby incorporated by reference herein.

BACKGROUND

The present disclosure relates to a semiconductor device, and in particular, to a semiconductor device including a field effect transistor.

Due to their small-size, multiple functions, and/or low-cost characteristics, semiconductor devices are important elements in the electronic industry. Semiconductor devices may store data, process data or store and process data. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

One or more example embodiments provide a highly-integrated semiconductor device, which includes field effect transistors of improved electric characteristics.

According to an aspect of an example embodiment, a semiconductor device includes a substrate including a first dummy region and a second dummy region spaced apart from the first dummy region; a device isolation layer filling a trench between the first dummy region and the second dummy region; a first dummy electrode provided on the first dummy region; a second dummy electrode provided on the second dummy region; a power line extending from the first dummy region to the second dummy region, the power line including an expanded portion provided on the device isolation layer, a width of the expanded portion being larger than a line width of a remaining portion of the power line; a power delivery network provided on a bottom surface of the substrate; and a through via extending through the substrate and the device isolation layer, and electrically connecting the power delivery network to the expanded portion. The through via and the expanded portion vertically overlap.

According to an aspect of an example embodiment, a semiconductor device includes a substrate; first power lines and second power lines provided on the substrate, the first power lines and the second power lines being alternately arranged in a first direction and extending in a second direction; first tap cells provided on a first tap cell track of the substrate which extends in the first direction; second tap cells provided on a second tap cell track of the substrate which extends in the first direction; logic cells provided on the substrate between the first tap cell track and the second tap cell track; and a power delivery network provided on a bottom surface of the substrate. The first tap cell track and the second tap cell track are spaced apart from each other in the second direction, each of the first tap cells includes a first through via which extends through the substrate and electrically connects the power delivery network to a corresponding one of the first power lines, and each of the second tap cells includes a second through via which extends through the substrate and electrically connects the power delivery network to a corresponding one of the second power lines.

According to an aspect of an example embodiment, a semiconductor device includes logic cells and tap cells, which are two-dimensionally arranged on a substrate; a first metal layer provided on the logic cells and the tap cells; a second metal layer provided on the first metal layer; and a power delivery network provided on a bottom surface of the substrate. A first logic cell, which is one of the logic cells, includes: a first active region and a second active region; a gate electrode provided on the first active region and the second active region; an active contact that is adjacent to the gate electrode; and a gate contact electrically coupled to the gate electrode. A first tap cell, which is one of the tap cells and is adjacent to the first logic cell, includes: a first dummy region that is adjacent to the first active region; a second dummy region that is adjacent to the second active region; a dummy electrode provided on the first dummy region and the second dummy region; and a through via which vertically extends from the power delivery network through the substrate. The first metal layer includes a first power line and a second power line which extend across the first logic cell and the first tap cell in parallel, and the power delivery network and the first power line are electrically connected to each other through the through via in the first tap cell.

BRIEF DESCRIPTION OF THE DRAWINGS

The above and other aspects, features and advantages will be more clearly understood from the following description, taken in conjunction with the accompanying drawings in which.

DETAILED DESCRIPTION

Figure 1:
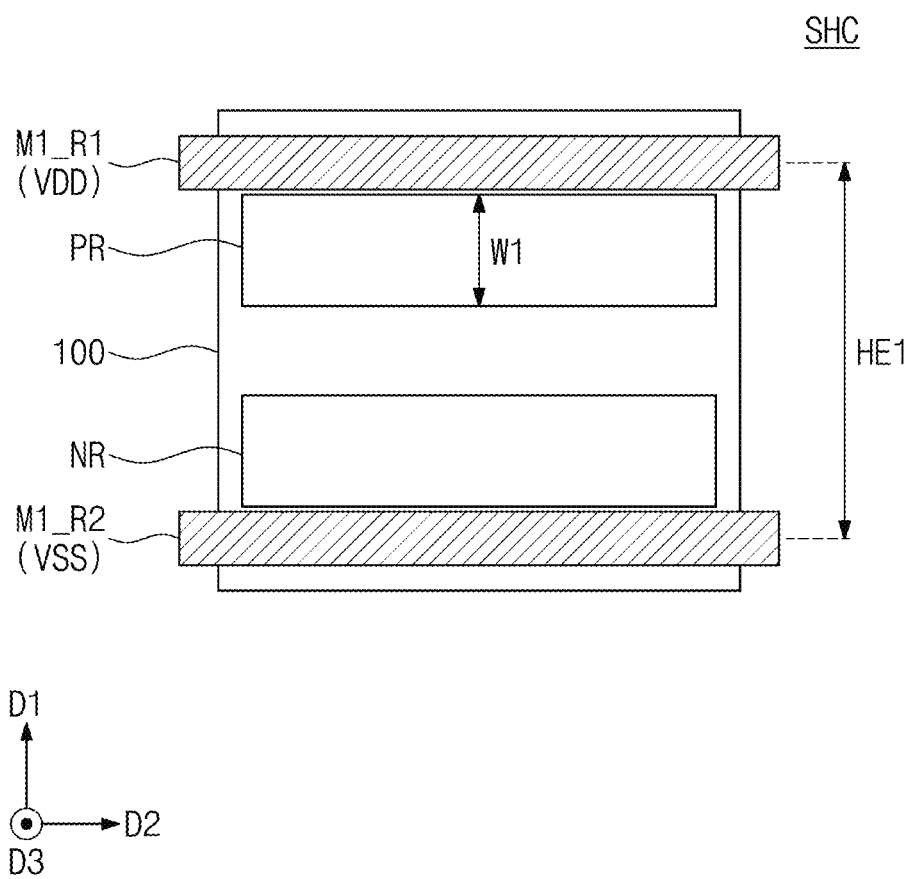
FIGS. 1 to 3 are conceptual diagrams illustrating logic cells of a semiconductor device according to example embodiments.
Figure 2:
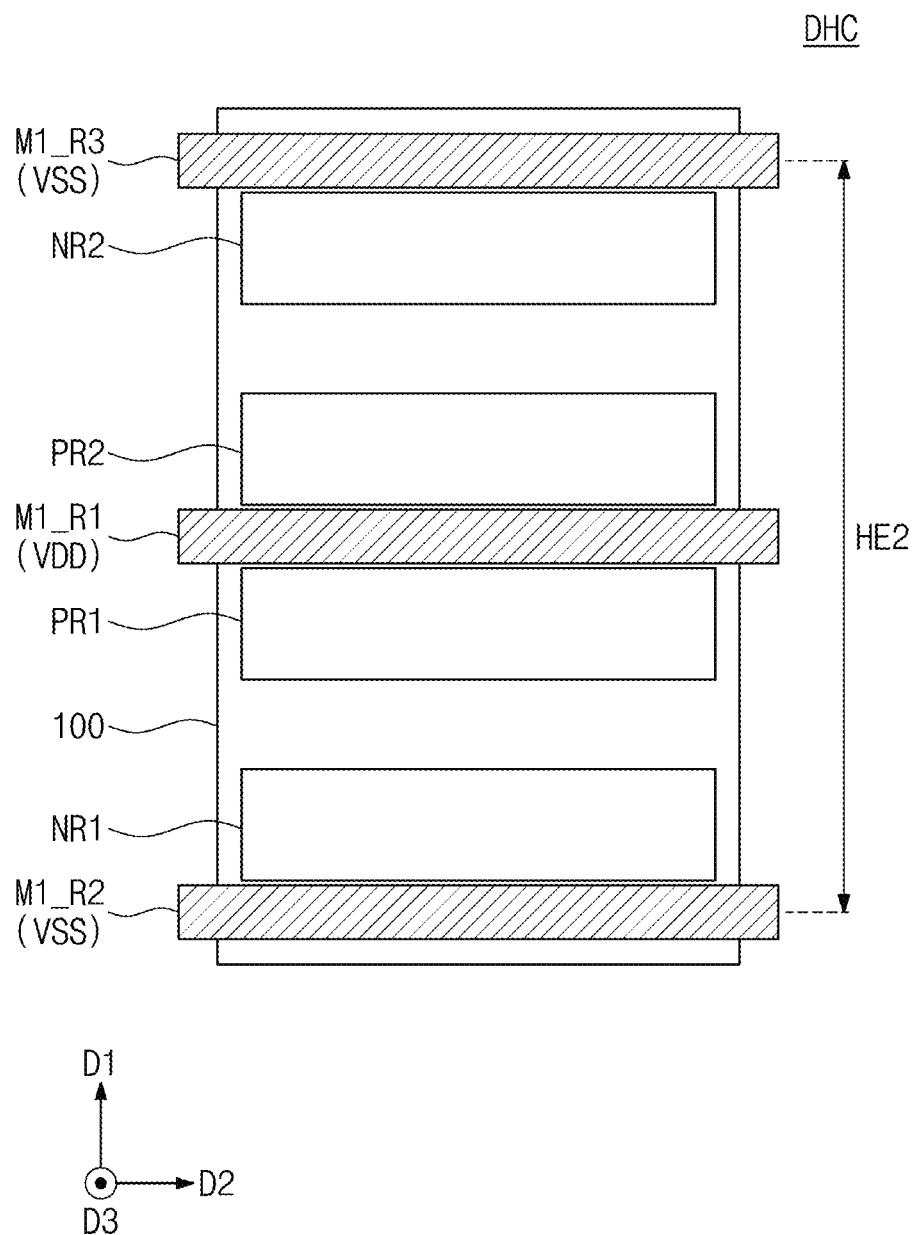
Figure 3:
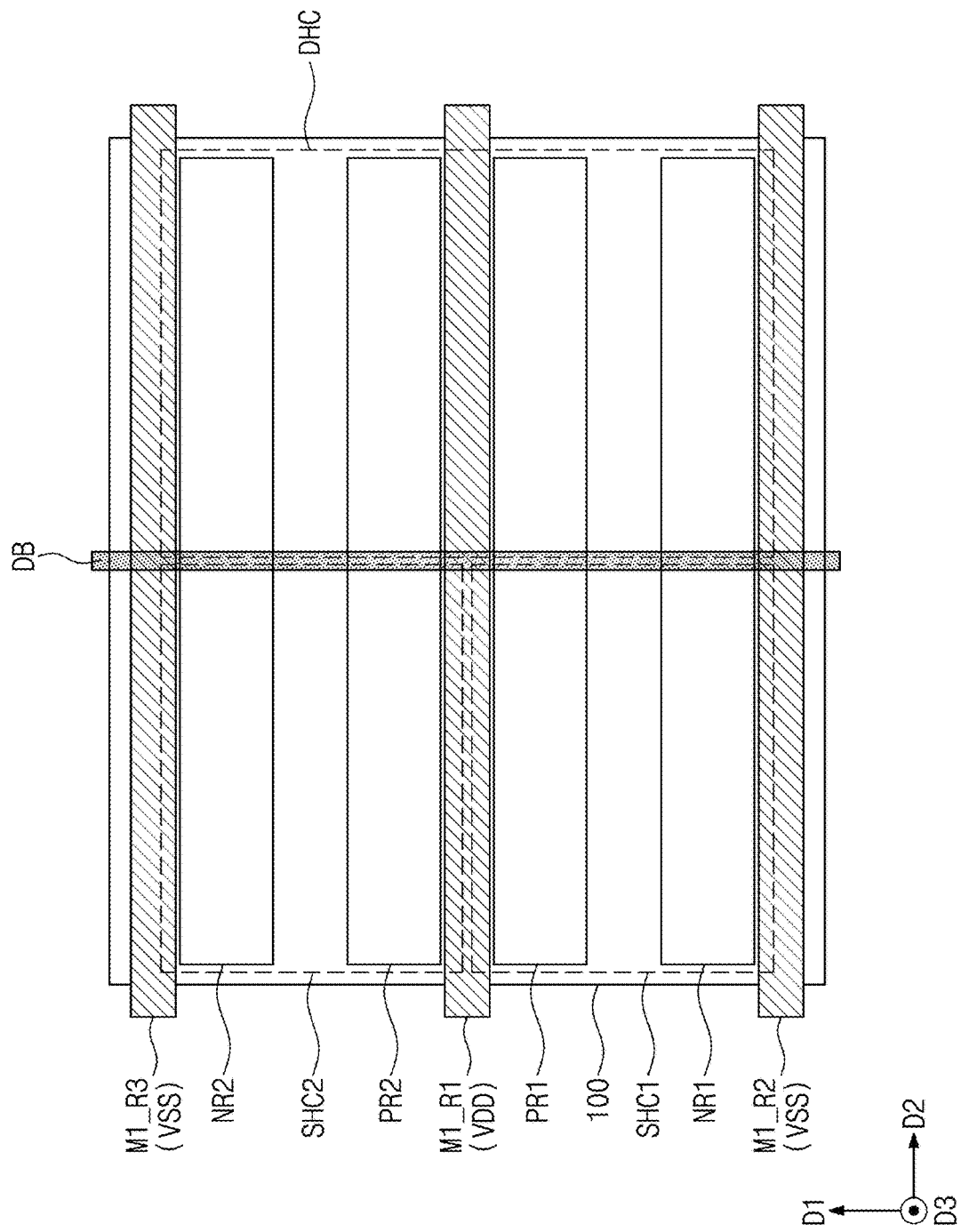

FIGS. 1, 2, and 3 are conceptual diagrams illustrating logic cells of a semiconductor device according to example embodiments.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first and second power lines M1_R1 and M1_R2. The single height cell SHC may include one first active region PR and one second active region NR. For example, the first active region PR may be a PMOSFET region, and the second active region NR may be an NMOSFET region. In other words, the single height cell SHC may have a CMOS structure provided between the first and second power lines M1_R1 and M1_R2.

Each of the first and second active regions PR and NR may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. The logic cell may indicate a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage VSS is provided.

The double height cell DHC may be defined between the second power line M1_R2 and the third power line M1_R3. The double height cell DHC may include first active regions PR1 and PR2 and second active regions NR1 and NR2.

The second active region NR1 may be provided near the second power line M1_R2. The second active region NR2 may be provided near the third power line M1_R3. The first active regions PR1 and PR2 may be respectively provided near opposite sides of the first power line M1_R1. When viewed in a plan view, the first power line M1_R1 may be disposed between the first active regions PR1 and PR2.

A length of the double height cell DHC in the first direction D1 may be defined as a second height HE2. The second height HE2 may be about two times the first height HE1 of FIG. 1. The first active regions PR1 and PR2 of the double height cell DHC may be combined to serve as a single PMOSFET region. Thus, a channel size of a PMOS transistor of the double height cell DHC may be greater than a channel size of a PMOS transistor of the single height cell SHC previously described with reference to FIG. 1.

For example, the channel size of the PMOS transistor of the double height cell DHC may be about two times the channel size of the PMOS transistor of the single height cell SHC. In this case, the double height cell DHC may be operated at a higher speed than the single height cell SHC. In an example embodiment, the double height cell DHC shown in FIG. 2 may be defined as a multi-height cell. Although the double height cell DHC is illustrated, example embodiments are not limited thereto and the multi-height cell may include a triple height cell whose cell height is about three times that of the single height cell SHC.

Referring to FIG. 3, a first single height cell SHC1, a second single height cell SHC2, and the double height cell DHC may be disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
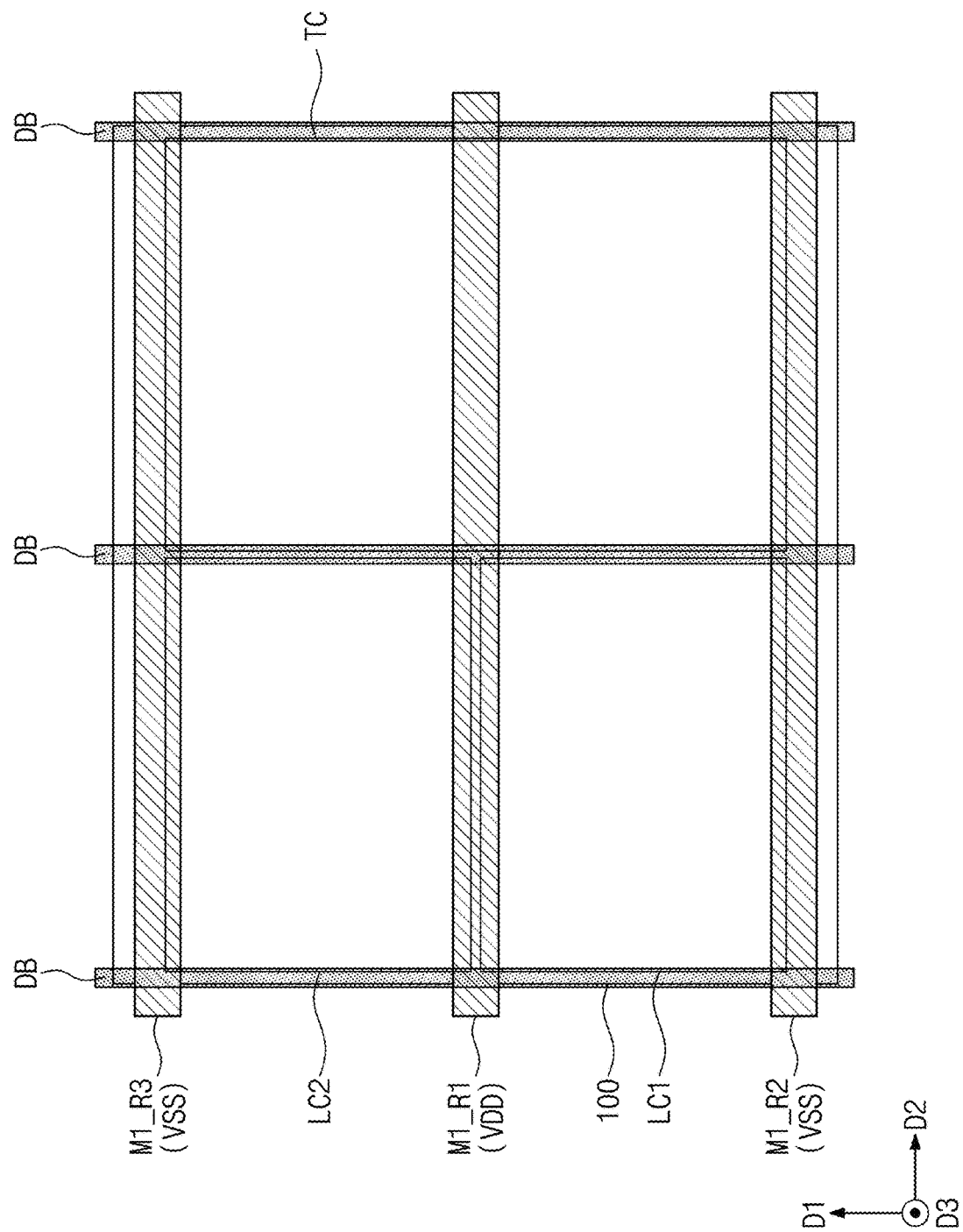
FIG. 4 is a plan view illustrating logic cells and a tap cell in a semiconductor device according to an example embodiment.

FIG. 4 is a plan view illustrating logic cells and a tap cell in a semiconductor device according to an example embodiment. Referring to FIG. 4, a first logic cell LC1, a second logic cell LC2, and a tap cell TC may be two-dimensionally disposed on the substrate 100. In detail, the first logic cell LC1 may be disposed in place of the first single height cell SHC1 of FIG. 3, the second logic cell LC2 may be disposed in place of the second single height cell SHC2 of FIG. 3, and the tap cell TC may be disposed in place of the double height cell DHC of FIG. 3.

The tap cell TC may be used to apply a voltage, which is provided from a power delivery network to be described below, to at least one of the first and third power lines M1_R1 and M1_R3. The tap cell TC may not include the logic device, in contrast to the first and second logic cells LC1 and LC2. That is, the tap cell TC may be configured to apply a voltage to the power line but may be a dummy cell that does not serve as a circuit element.

As illustrated in FIG. 4, the tap cell TC may be disposed in a cell region, in which the logic cells are provided, and between the logic cells. The relative arrangement of the tap cell TC and the first and second logic cells LC1 and LC2 is not limited to the example illustrated in FIG. 4 and may be variously changed.

Figure 5:
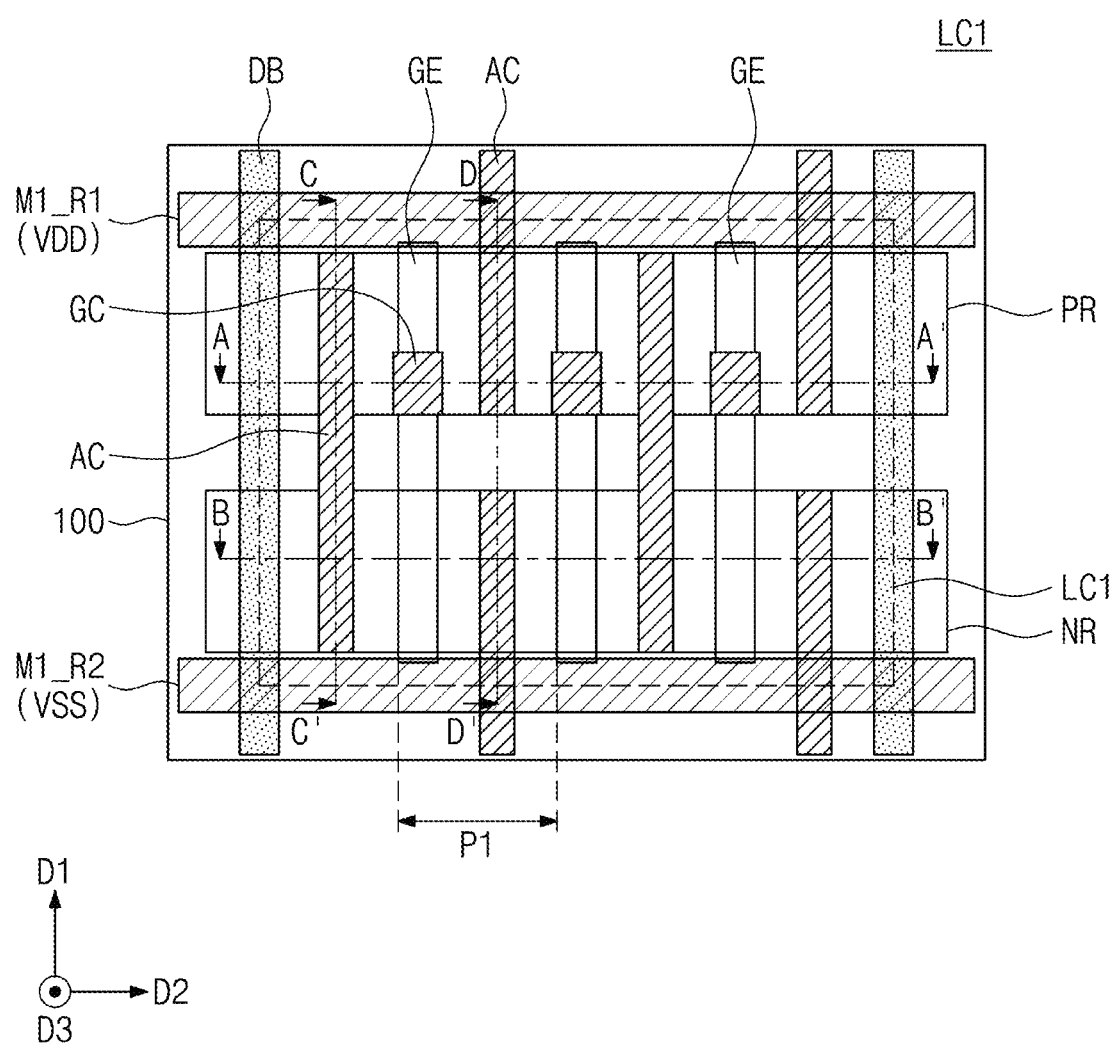
FIG. 5 is a plan view illustrating a detailed structure of a first logic cell according to an example embodiment.

FIG. 5 is a plan view illustrating a detailed structure of a first logic cell of FIG. 4. FIGS. 6A to 6D are sectional views, which are respectively taken along lines A-A', B-B', C-C', and D-D' of FIG. 5. Hereinafter, the first logic cell LC1 will be described in more detail with reference to FIGS. 5 and 6A to 6D.

The substrate 100 may include the first active region PR and the second active region NR. In an example embodiment, the first active region PR may be a PMOSFET region, and the second active region NR may be an NMOSFET region. The substrate 100 may be a semiconductor substrate that is formed of or includes silicon, germanium, silicon-germanium, a compound semiconductor material, or the like. As an example, the substrate 100 may be a silicon wafer.

The first and second active regions PR and NR may be defined by a second trench TR2, which is formed in an upper portion of the substrate 100. The second trench TR2 may be located between the first and second active regions PR and NR. The first and second active regions PR and NR may be spaced apart from each other, in the first direction D1, with the second trench TR2 interposed therebetween. Each of the first and second active regions PR and NR may extend in a second direction D2 that is different from the first direction D1.

First active patterns AP1 and second active patterns AP2 may be provided on the first active region PR and the second active region NR, respectively. The first and second active patterns AP1 and AP2 may extend in the second direction D2 to be parallel to each other. The first and second active patterns AP1 and AP2 may be vertically protruding portions of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 6D). Each of the upper portions of the first and second active patterns AP1 and AP2 may be a fin-shaped pattern. The device isolation layer ST may not cover the upper portions of the first and second active patterns AP1 and AP2. The device isolation layer ST may not cover upper side surfaces of the first and second active patterns AP1 and AP2.

First source/drain patterns SD1 may be provided on the upper portions of the first active patterns AP1. The first source/drain patterns SD1 may be impurity regions of a first conductivity type (e.g., p-type). A first channel pattern CH1 may be interposed between each pair of the first source/drain patterns SD1. Second source/drain patterns SD2 may be provided on the upper portions of the second active patterns AP2. The second source/drain patterns SD2 may be impurity regions of a second conductivity type (e.g., n-type). A second channel pattern CH2 may be interposed between each pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor material (e.g., SiGe) having a lattice constant greater than that of the substrate 100. Accordingly, the first source/drain patterns SD1 may exert a compressive stress on the first channel patterns CH1. As an example, the second source/drain patterns SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged with a first pitch P1 in the second direction D2 (e.g., see FIG. 5). The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Figure 6A:
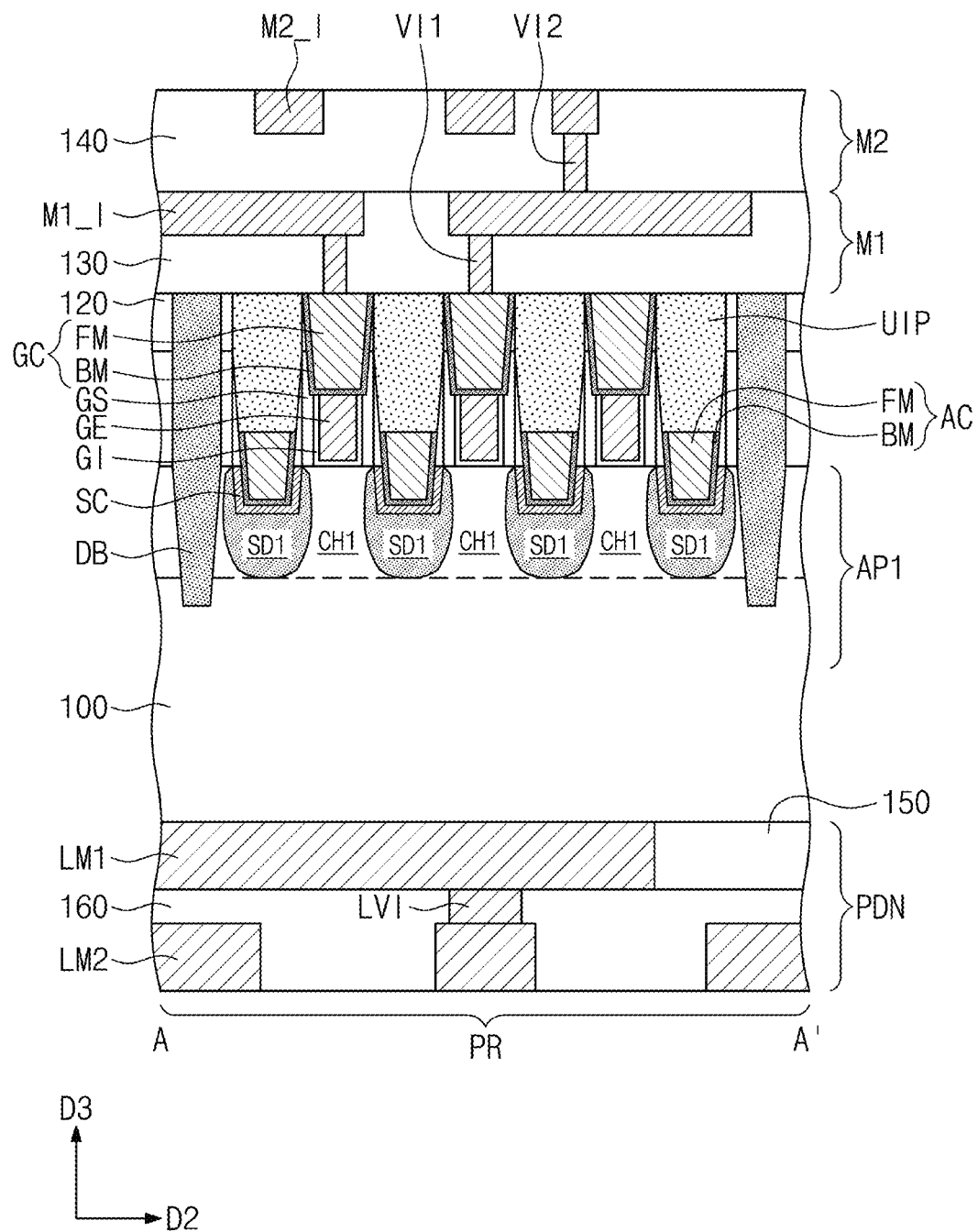
FIGS. 6A, 6B, 6C and 6D are sectional views, which are respectively taken along lines A-A', B-B', C-C', and D-D' of FIG. 5, according to example embodiments.
Figure 6B:
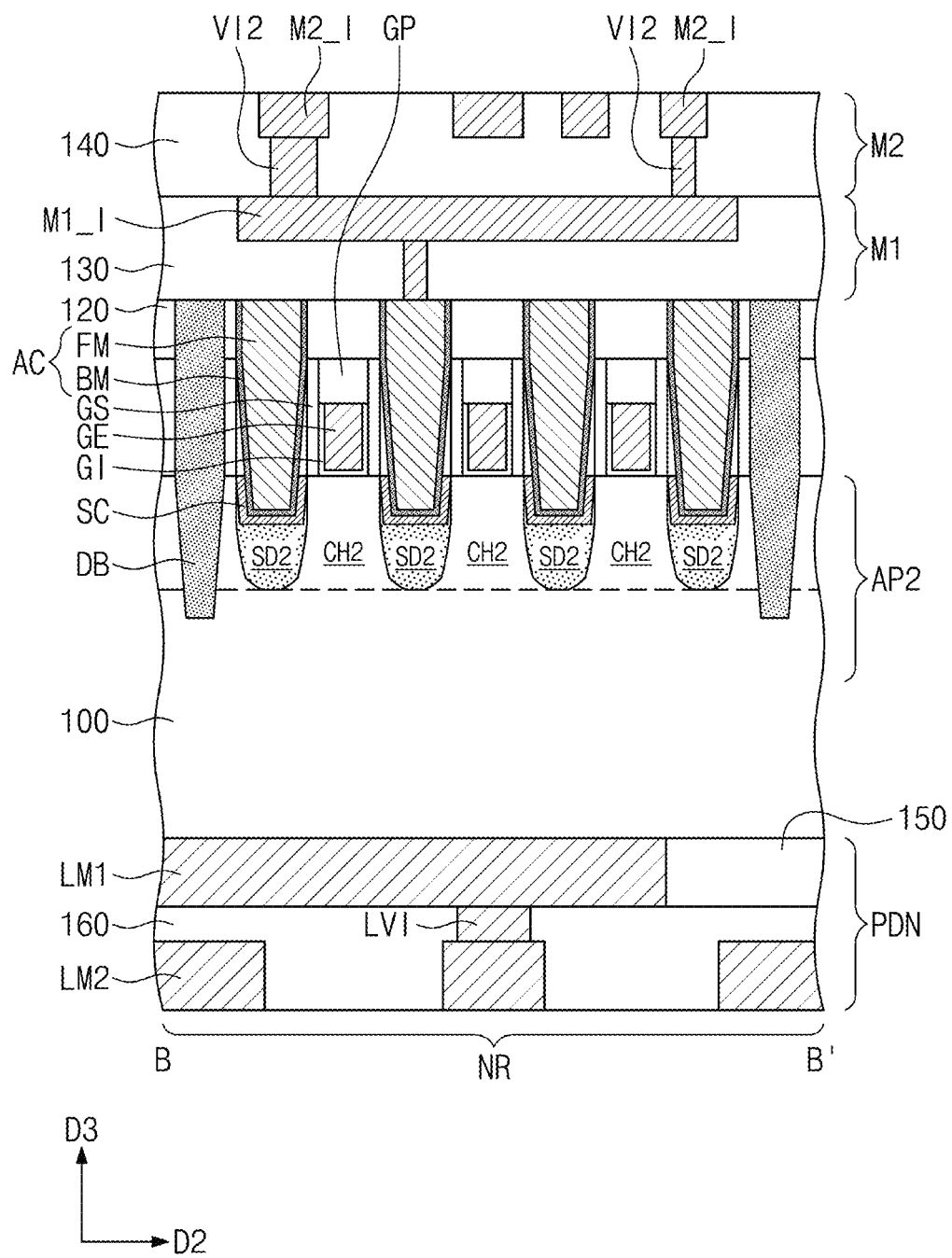
Figure 6C:
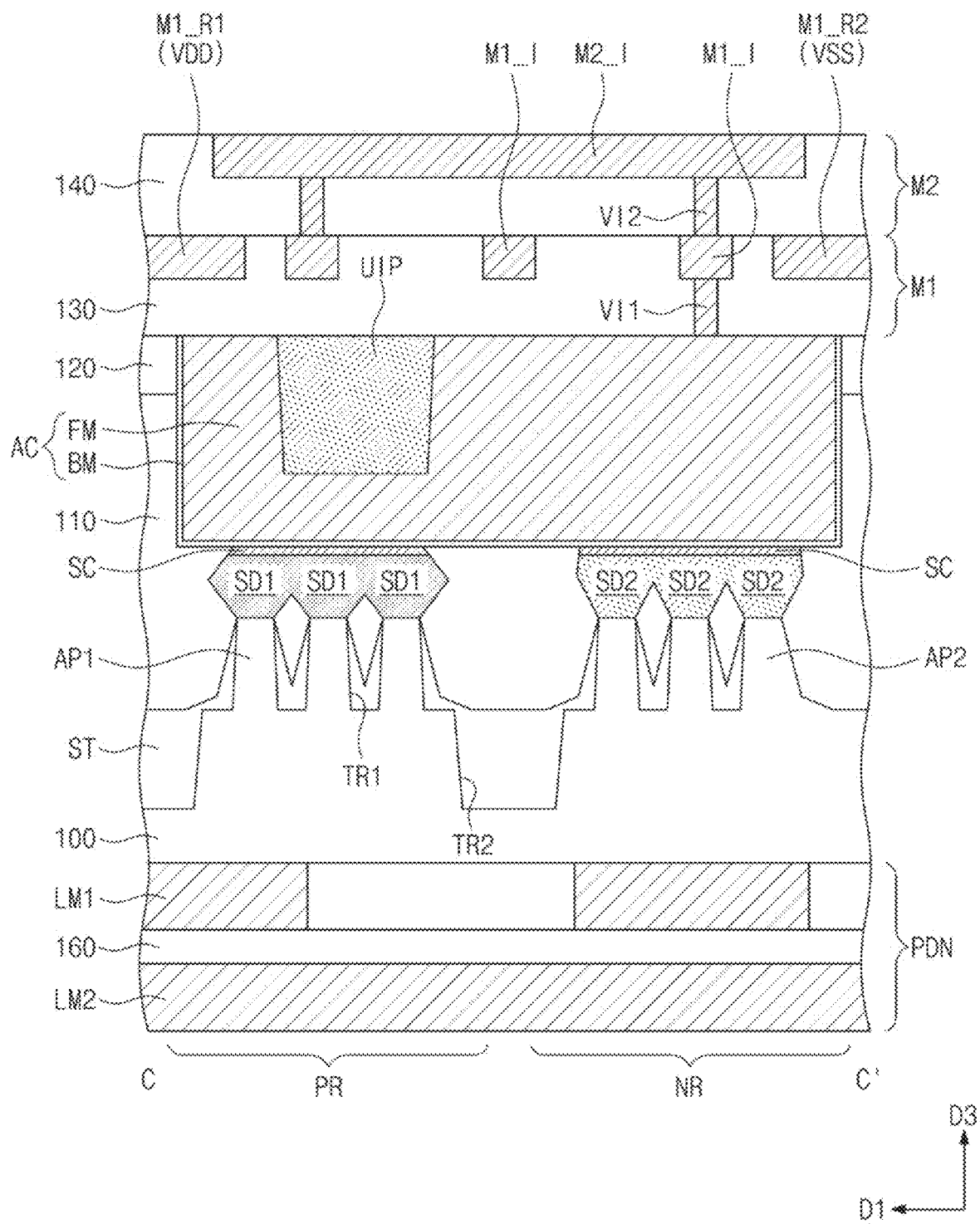
Figure 6D:
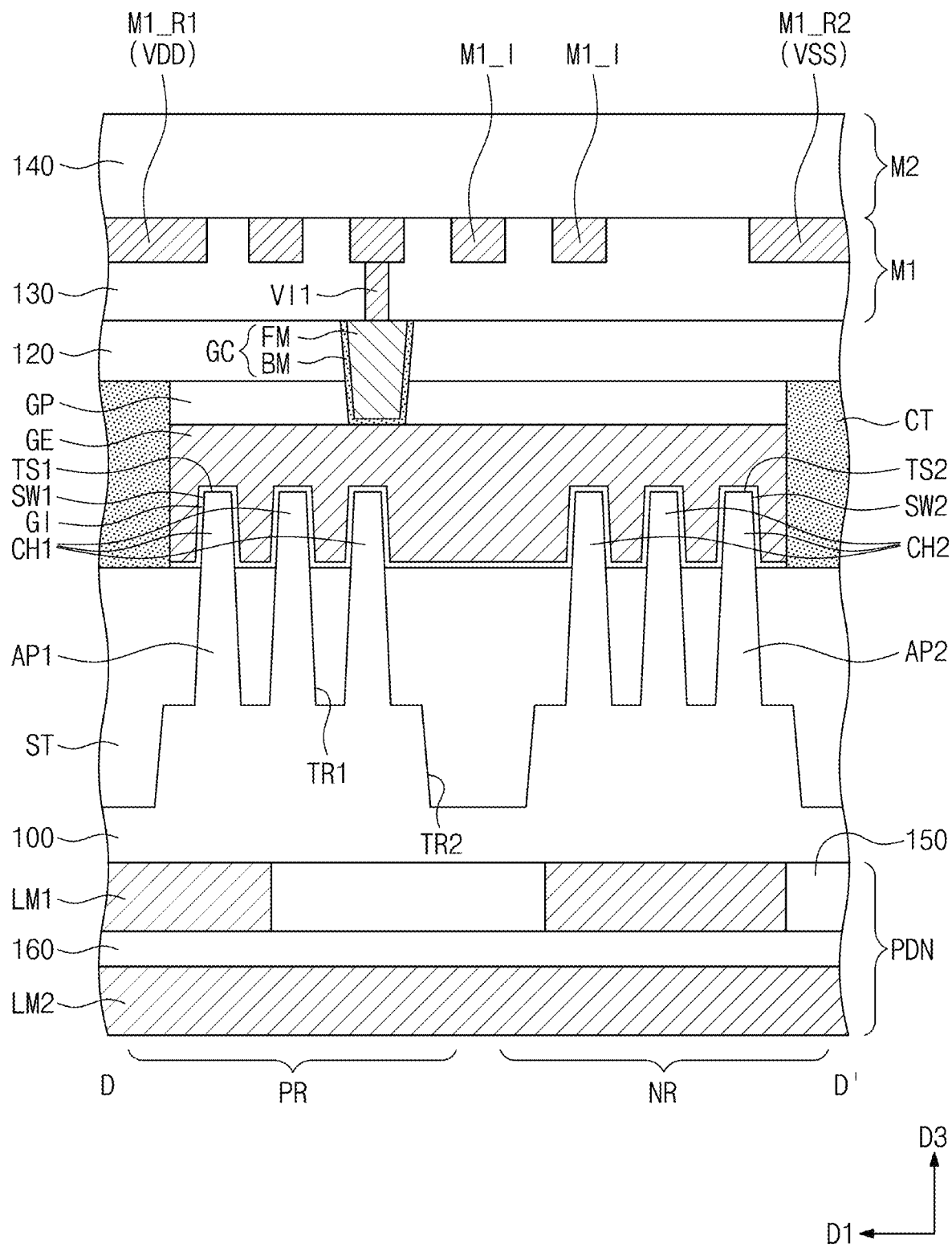

Referring to FIG. 6D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. In other words, the transistor may be a three-dimensional field-effect transistor (e.g., FinFET), in which the gate electrode GE is provided to three-dimensionally surround the channel patterns CH1 and CH2.

Referring to FIGS. 5 and 6A to 6D, a pair of gate spacers GS may be disposed on opposite side surfaces of each of the gate electrodes GE. The gate spacer GS may extend along the gate electrode GE in the first direction D1. A top surface of the gate spacer GS may be higher than the top surface of the gate electrode GE. The top surface of the gate spacer GS may be coplanar with a top surface of a first interlayer insulating layer 110, which will be described below. The gate spacer GS may be formed of or include at least one of SiCN, SiCON, or SiN. As another example, the gate spacer GS may be a multi-layered structure including at least two of SiCN, SiCON, or SiN.

A gate capping pattern GP may be provided on each of the gate electrodes GE. The gate capping pattern GP may extend along the gate electrode GE in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate dielectric pattern GI may be interposed between the gate electrode GE and the first active pattern AP1 and between and the gate electrode GE and the second active pattern AP2. The gate dielectric pattern GI may along a bottom surface of the gate electrode GE disposed thereon. As an example, the gate dielectric pattern GI may cover the first top surface TS1 and the first side surface SW1 of the first channel pattern CH1. The gate dielectric pattern GI may cover the second top surface TS2 and the second side surfaces SW2 of the second channel pattern CH2. The gate dielectric pattern GI may cover a top surface of the device isolation layer ST below the gate electrode GE (e.g., see FIG. 6D).

In an example embodiment, the gate dielectric pattern GI may be formed of or include a high-k dielectric material, whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric pattern GI to be adjacent to the first and second channel patterns CH1 and CH2. The first metal pattern may include a work function metal which controls a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which is selected from the group consisting of titanium (Ti), tantalum (Ta), aluminum (Al), tungsten (W), and molybdenum (Mo), and nitrogen (N). The first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta).

Referring to FIG. 6D, cutting patterns CT may be provided at both ends of the gate electrode GE. The cutting pattern CT may separate the gate electrode GE of the first logic cell LC1 from the gate electrode of the second logic cell LC2 adjacent thereto. The cutting pattern CT may be formed of or include at least one of insulating materials (e.g., silicon oxide and/or silicon nitride).

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In an example embodiment, at least one of the first to fourth interlayer insulating layers 110-140 may be formed of or include silicon oxide.

A pair of the division structures DB, which are opposite to each other in the second direction D2, may be provided on opposite borders of the first logic cell LC1. The division structure DB may extend in the first direction D1 in parallel with the gate electrodes GE.

The division structure DB may penetrate the first and second interlayer insulating layers 110 and 120 and may extend into the first and second active patterns AP1 and AP2. The division structure DB may penetrate an upper portion of each of the first and second active patterns AP1 and AP2. The division structure DB may separate the active regions PR and NR of the first logic cell LC1 from the active region of a neighboring logic cell.

Active contacts AC may penetrate the first and second interlayer insulating layers 110 and 120 and may be electrically connected to the first and second source/drain patterns SD1 and SD2. For example, the active contact AC of the first logic cell LC1 may be provided between the gate electrode GE and the division structure DB. The active contact AC may extend in the first direction D1 to connect the second source/drain pattern SD2 to the first source/drain pattern SD1 (e.g., see FIG. 6C).

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. The active contact AC may be provided to cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the first and second source/drain patterns SD1 and SD2 through the silicide pattern SC. The silicide pattern SC may be formed of or include at least one of metal silicide materials (e.g., titanium silicide, tantalum silicide, tungsten silicide, nickel silicide, or cobalt silicide).

Gate contacts GC may penetrate the second interlayer insulating layer 120 and the gate capping pattern GP and may be electrically connected to the gate electrodes GE, respectively. Referring to FIG. 6A, a region which is located on each active contact AC near the gate contact GC, may be filled with an upper insulating pattern UIP. Accordingly, it may be possible to prevent the gate contact GC from being in contact with the active contact AC adjacent thereto and thereby prevent a short circuit issue from occurring.

Each of the active and gate contacts AC and GC may include a conductive pattern FM and a barrier pattern BM enclosing the conductive pattern FM. The conductive pattern FM may be formed of or include at least one metallic material of, for example, aluminum, copper, tungsten, molybdenum, or cobalt. The barrier pattern BM may cover side and bottom surfaces of the conductive pattern FM. The barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. The first metal layer M1 of the first logic cell LC1 may include the first power line M1_R1, the second power line M1_R2, and first interconnection lines M1_I therebetween.

Each of the first and second power lines M1_R1 and M1_R2 may extend in the second direction D2 to cross the first logic cell LC1. The first interconnection lines M1_I may be disposed between the first and second power lines M1_R1 and M1_R2. Each of the first interconnection lines M1_I may be a line-shaped or bar-shaped pattern extending in the second direction D2.

The first metal layer M1 may further include first vias VI1. Each of the first vias VI1 may be provided below the interconnection line of the first metal layer M1. For example, the first via VI1 may be interposed between the active contact AC and the first interconnection line M1_I to electrically connect them to each other. The first via VI1 may be interposed between the active contact AC and the power line M1_R1 or M1_R2 to electrically connect them to each other. The first via VI1 may be interposed between the gate contact GC and the first interconnection line M1_I to electrically connect them to each other.

In an example embodiment, the interconnection line of the first metal layer M1 may be separately formed by a processes that is different from that for the first via VI1 thereunder. For example, the interconnection line and the first via VI1 of the first metal layer M1 may be formed by respective single damascene processes. The semiconductor device according may be fabricated using a sub-20 nanometer (nm) process.

A second metal layer M2 may be provided in the fourth interlayer insulating layer 140. The second metal layer M2 may include second interconnection lines M2_I. Each of the second interconnection lines M2_I of the second metal layer M2 may be a line-shaped or bar-shaped pattern extending in the first direction D1. In other words, the second interconnection lines M2_I may extend in the first direction D1 and parallel to each other.

The second metal layer M2 may further include second vias VI2. Each of the second vias VI2 may be provided below the second interconnection line M2_I. For example, the second interconnection line M2_I may be electrically connected to the first interconnection line M1_I through the second via VI2.

As an example, the second interconnection line M2_I of the second metal layer M2 and the second via VI2 thereunder may be formed at the same time by the same process. For example, the second interconnection line M2_I and the second via VI2 of the second metal layer M2 may be formed together by a dual damascene process.

The interconnection lines of the first metal layer M1 may be formed of or include a conductive material that is the same as or different from that of the second metal layer M2. For example, the interconnection lines of the first and second metal layers M1 and M2 may be formed of or include at least one of aluminum, copper, tungsten, molybdenum, or cobalt. A plurality of metal layers (e.g., M3, M4, M5, M6, M7 and so forth) may be additionally stacked on the fourth interlayer insulating layer 140. Each of the stacked metal layers may include interconnection lines constituting a routing structure.

A power delivery network PDN may be provided on a bottom surface of the substrate 100. The power delivery network PDN may include a fifth interlayer insulating layer 150 and a sixth interlayer insulating layer 160, which are sequentially stacked on the bottom surface of the substrate 100.

The power delivery network PDN may further include first lower interconnection lines LM1 and second lower interconnection lines LM2. The first lower interconnection lines LM1 may be provided in the fifth interlayer insulating layer 150, and the second lower interconnection lines LM2 may be provided in the sixth interlayer insulating layer 160. A lower via LVI may be provided between the first and second lower interconnection lines LM1 and LM2.

The power delivery network PDN may constitute a network to apply voltages to the first and second power lines M1_R1 and M1_R2. Lower metal layers may be additionally disposed below the sixth interlayer insulating layer 160.

Figure 7:
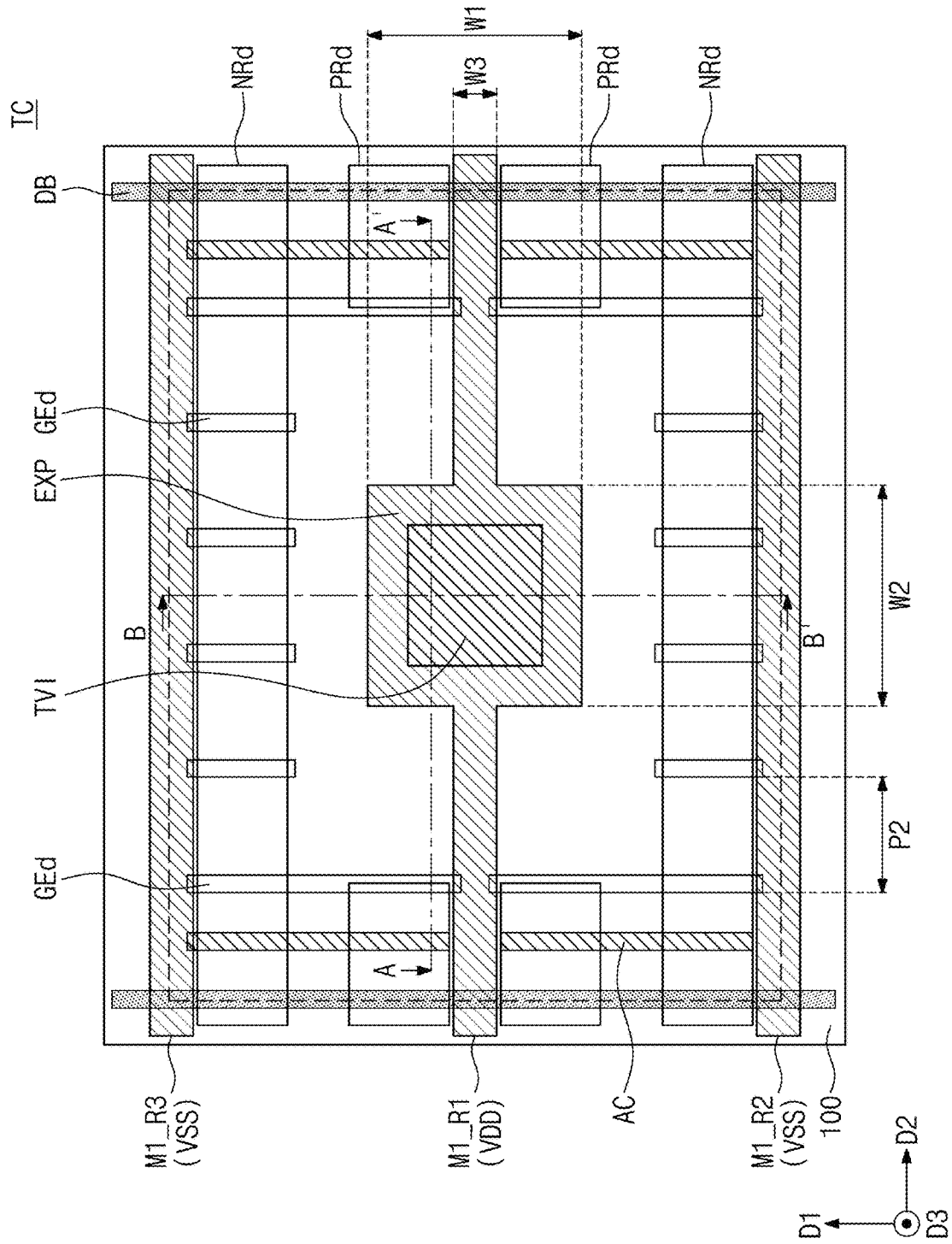
FIG. 7 is a plan view illustrating a detailed structure of the tap cell of FIG. 4, according to an example embodiment.
Figure 8A:
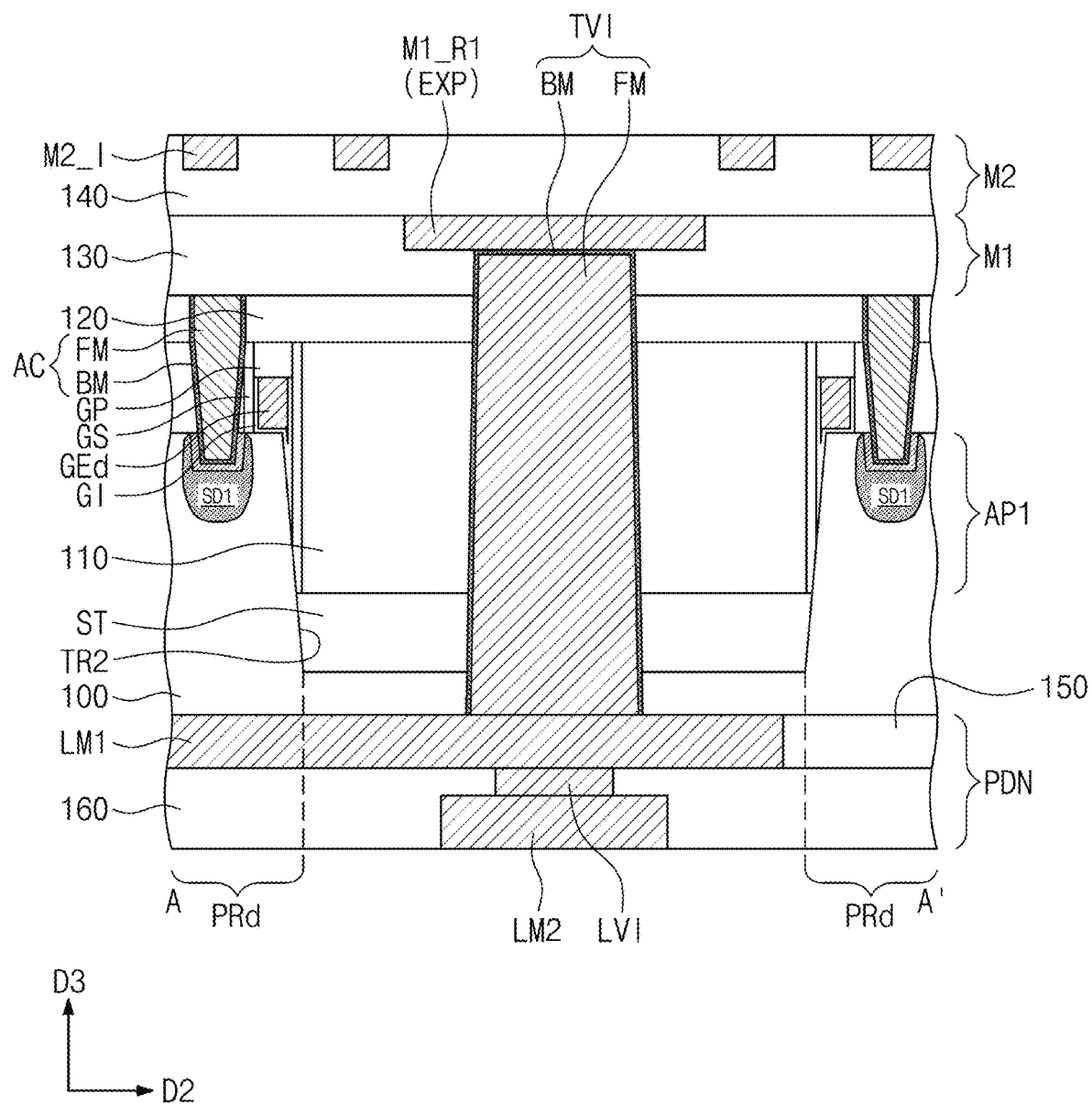
FIGS. 8A and 8B are sectional views, which are respectively taken along lines A-A' and B-B' of FIG. 7, according to example embodiments.
Figure 8B:
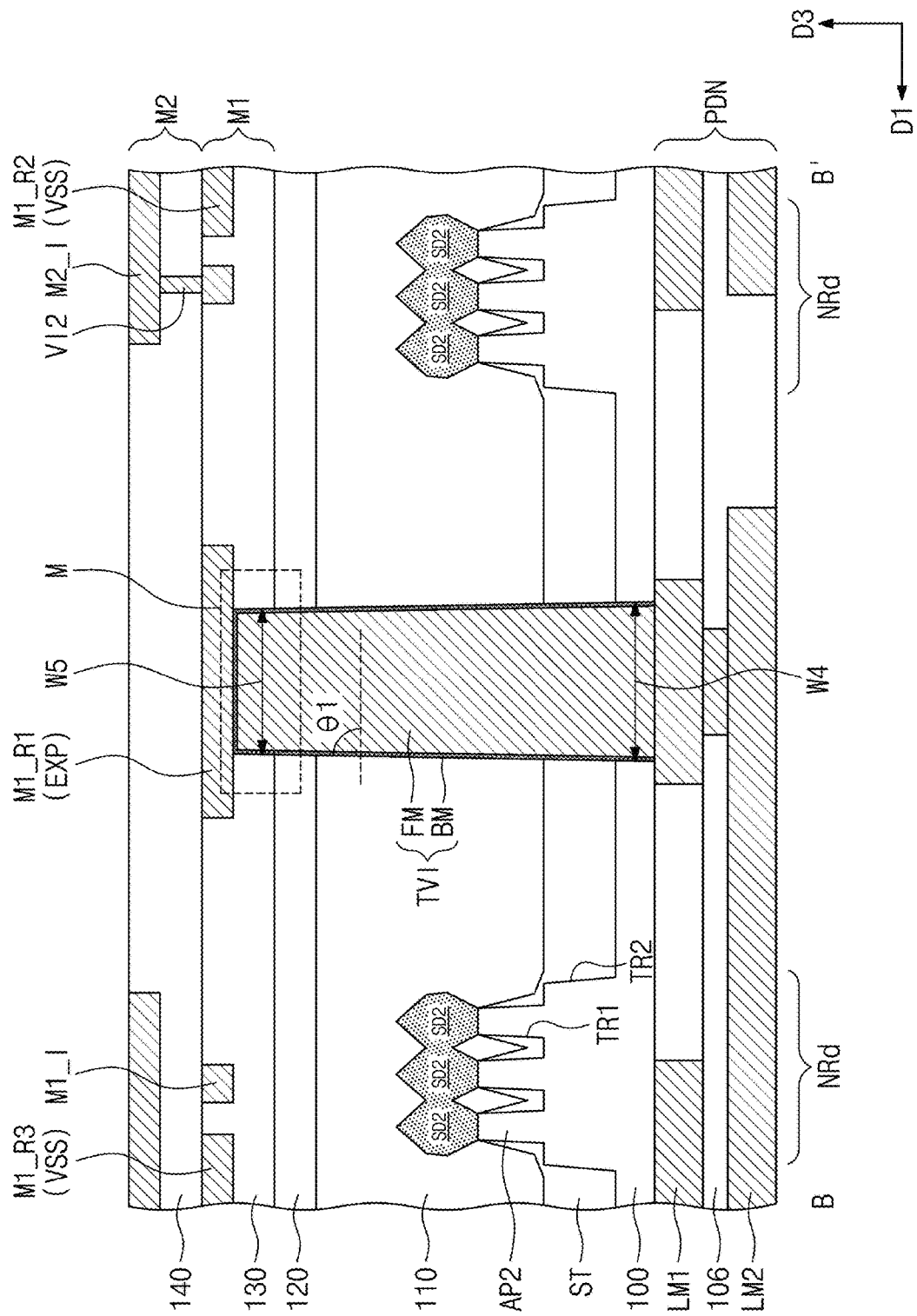
Figure 9:
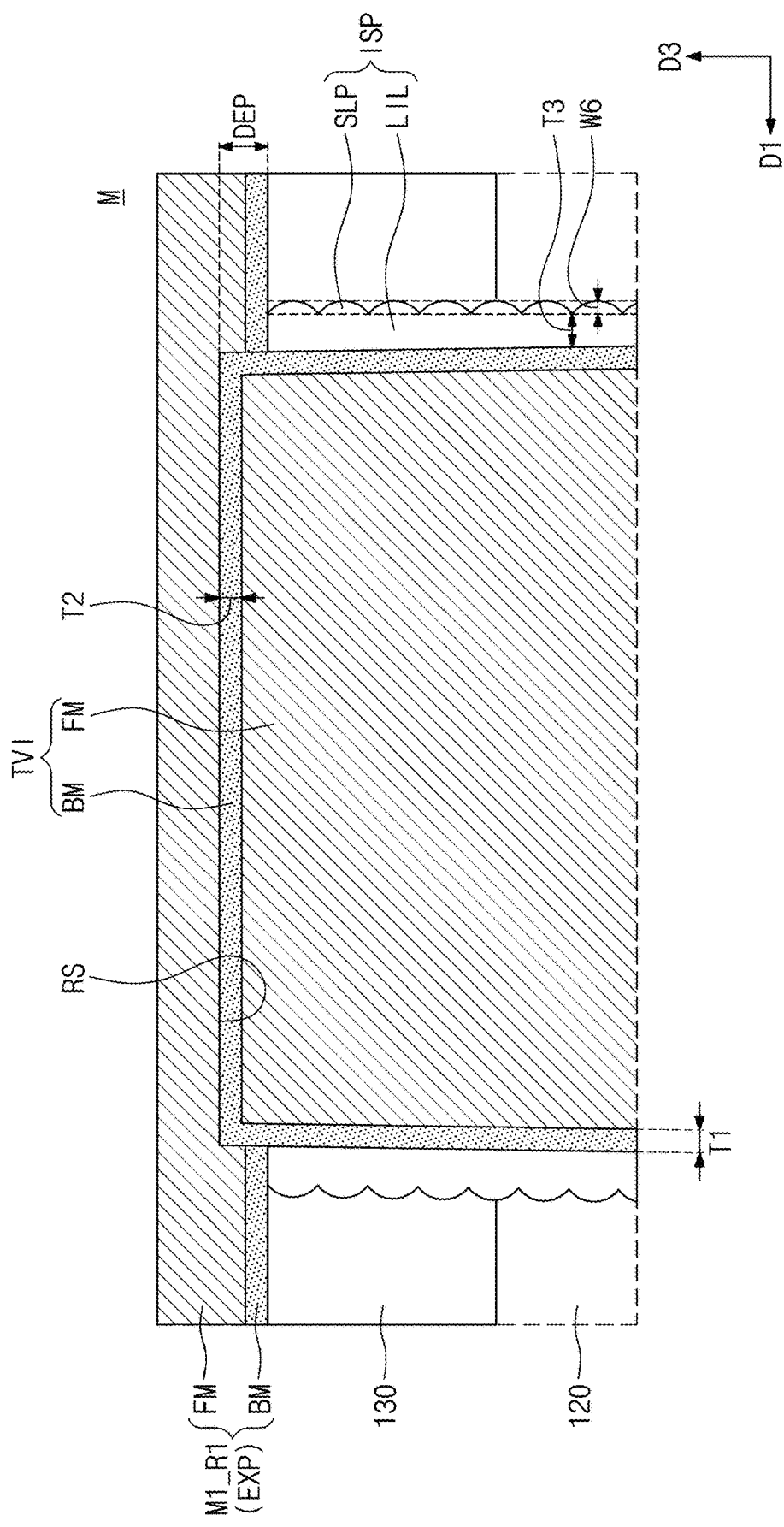
FIG. 9 is an enlarged sectional view of a portion M of FIG. 8B according to an example embodiment.

FIG. 7 is a plan view illustrating a detailed structure of the tap cell of FIG. 4, according to an example embodiment. FIGS. 8A and 8B are sectional views, which are respectively taken along lines A-A' and B-B' of FIG. 7. FIG. 9 is an enlarged sectional view of a portion M of FIG. 8B. Hereinafter, the tap cell TC will be described in more detail with reference to FIGS. 7, 8A, and 8B. Some features of the tap cell TC overlapped with the first logic cell LC1 may be omitted in the following description.

The tap cell TC may include at least one first and second dummy regions PRd and NRd. The first dummy region PRd may be the same as the first active region PR in their structures on the substrate 100 but may not constitute the logic circuit. The second dummy region NRd may be the same as the second active region NR in their structures on the substrate 100 but may not constitute the logic circuit.

The first and second dummy regions PRd and NRd may serve as a buffer between the tap cell TC and the logic cells (e.g., LC1 and LC2) adjacent thereto. Due to the first and second dummy regions PRd and NRd, it may be possible to reduce the electrical influence of the tap cell TC on neighboring logic cells.

Dummy electrodes GEd may be provided on the first and second dummy regions PRd and NRd. The dummy electrodes GEd may be arranged with a second pitch P2 in the second direction D2 (e.g., see FIG. 7). The second pitch P2 may be substantially equal to the first pitch P1 between the gate electrodes GE. The dummy electrode GEd may include the same structure as the gate electrode GE described above but may not be used as a part of a circuit.

At least one of the active contact AC may be provided on at least one of the first and second dummy regions PRd and NRd. At least one active contact AC in the tap cell TC may not be connected to the first metal layer M1. For example, the at least one active contact AC in the tap cell TC may be a dummy active contact.

At least one of the power lines (e.g., the first power line M1_R1) in the tap cell TC may include an expanded portion EXP. The first and second dummy regions PRd and NRd may be spaced apart from the expanded portion EXP by a specific distance. In other words, the expanded portion EXP of the first power line M1_R1 may not be overlapped with the first and second dummy regions PRd and NRd. The expanded portion EXP of the first power line M1_R1 may be provided on the device isolation layer ST filling the second trench TR2.

Due to the expanded portion EXP, the first power line M1_R1 may have an increased effective width in the first direction D1. In detail, the expanded portion EXP may have the first width W1 in the first direction D1 and a second width W2 in the second direction D2. The first width W1 may be equal to or different from the second width W2. As an example, the first width W1 may be smaller than the second width W2. The first width W1 may be 3 to 10 times the line width W3 of the first power line M1_R1. The first width W1 may be 1.5 to 7 times the first pitch P1. The second width W2 may be 2 to 8 times the first pitch P1.

The tap cell TC may include a through via TVI, which penetrates the substrate 100 and extends from the power delivery network PDN to the expanded portion EXP of the first power line M1_R1. The through via TVI may be a pillar-shaped pattern that extends in a vertical direction (e.g., a third direction D3). A bottom surface of the through via TVI may be connected to the first lower interconnection line LM1. A top surface of the through via TVI may be connected to the expanded portion EXP of the first power line M1_R1. A via or a contact may be interposed between the through via TVI and the first lower interconnection line LM1.

The first lower interconnection line LM1 of the power delivery network PDN and the first power line M1_R1 of the first metal layer M1 may be electrically connected to each other through the through via TVI. In other words, a voltage from the power delivery network PDN may be applied to the power line of the first metal layer M1 through the through via TVI. The tap cell TC may be a power tap cell, which is configured to apply a voltage from the power delivery network PDN to the power line of the first metal layer M1.

The through via TVI may be vertically overlapped with the expanded portion EXP. The through via TVI may sequentially penetrate the substrate 100, the device isolation layer ST filling the second trench TR2, and the first to third interlayer insulating layers 110, 120, and 130. The through via TVI may be provided between the first dummy regions PRd, which are adjacent to each other in the second direction D2. The through via TVI may be provided between the second dummy regions NRd, which are adjacent to each other in the first direction D1.

The through via TVI may have a width that decreases with as distance from the power delivery network PDN increases or as distance to the first metal layer M1 decreases. The through via TVI may have a fourth width W4 at its bottom level and a fifth width W5, which is smaller than the fourth width W4, at its top level. In an example embodiment, the fourth width W4 may be 1.2 to 2 times the fifth width W5. The through via TVI may have a side surface that is inclined to the bottom surface of the substrate 100. An angle θ1 between the side surface of the through via TVI and the bottom surface of the substrate 100 may range from 85° to 89.5°.

The through via TVI may include the conductive pattern FM and the barrier pattern BM enclosing the conductive pattern FM. The conductive pattern FM may be formed of or include at least one metal of aluminum, copper, tungsten, molybdenum, or cobalt. The barrier pattern BM may be formed of or include at least one of titanium nitride (TiN), tantalum nitride (TaN), tungsten nitride (WN), nickel nitride (NiN), cobalt nitride (CoN), or platinum nitride (PtN).

Referring to FIG. 9, the first power line M1_R1 may include the barrier pattern BM and the conductive pattern FM. The conductive pattern FM may be provided on the barrier pattern BM. The expanded portion EXP of the first power line M1_R1 may include a recess region RS, which is provided in its lower portion. The recess region RS may be recessed from a bottom surface of the expanded portion EXP by a specific depth DEP.

An upper portion of the through via TVI may be provided in the recess region RS of the expanded portion EXP. The top surface of the through via TVI may be in contact with the conductive pattern FM of the first power line M1_R1. In the recess region RS, the barrier pattern BM of the through via TVI may be in contact with the conductive pattern FM of the first power line M1_R1.

A spacer ISP may be provided on the side surface of the through via TVI. For example, the spacer ISP may be interposed between the through via TVI and the interlayer insulating layers 120 and 130. The spacer ISP may not be provided in the recess region RS. The spacer ISP may have a top surface that covers a portion of the barrier pattern BM of the first power line M1_R1.

The spacer ISP may include a liner LIL, which extends along the side surface of the through via TVI, and a plurality of scallops SLP, which protrude from the liner LIL. In other words, the spacer ISP in contact with the interlayer insulating layers 120 and 130 may have a non-flat or uneven surface.

The barrier pattern BM of the through via TVI may have a first thickness T1 on the side surface of the through via TVI and may have a second thickness T2 on the top surface of the through via TVI. The second thickness T2 may be larger than the first thickness T1. The second thickness T2 may be smaller than the depth DEP of the recess region RS.

The liner LIL of the spacer ISP may have a third thickness T3. The third thickness T3 may be larger than the second thickness T2. The largest width of the scallops SLP of the spacer ISP may be a sixth width W6. The third thickness T3 may be 10 to 30 times the sixth width W6. The sixth width W6 may be smaller than the first thickness Ti.

According to an example embodiment, power delivery lines may be omitted from the stacked metal layers M2, M3, M4, M5, M6, M7 and so forth, and the power delivery network PDN may be disposed on the bottom surface of the substrate 100. Thus, it may be possible to increase an integration density of the semiconductor device and to increase a degree of freedom in constructing a routing structure in the stacked metal layers M2, M3, M4, M5, M6, M7 and so forth.

According to an example embodiment, the tap cell TC may be disposed in a cell region, in which logic cells LC are provided, and thus, it may be possible to stably apply a voltage from the power delivery network PDN to the power line. In addition, the dummy region PRd or NRd serving as the buffer may be disposed in the tap cell TC, and thus, it may be possible to reduce influence of the tap cell TC on the active region PR or NR of the logic cell LC adjacent thereto.

The power line in the tap cell TC may include the expanded portion EXP. Because the expanded portion EXP is formed to have a width larger than the through via TVI, the through via TVI of a relatively large diameter may be stably coupled to the power line.

Figure 10:
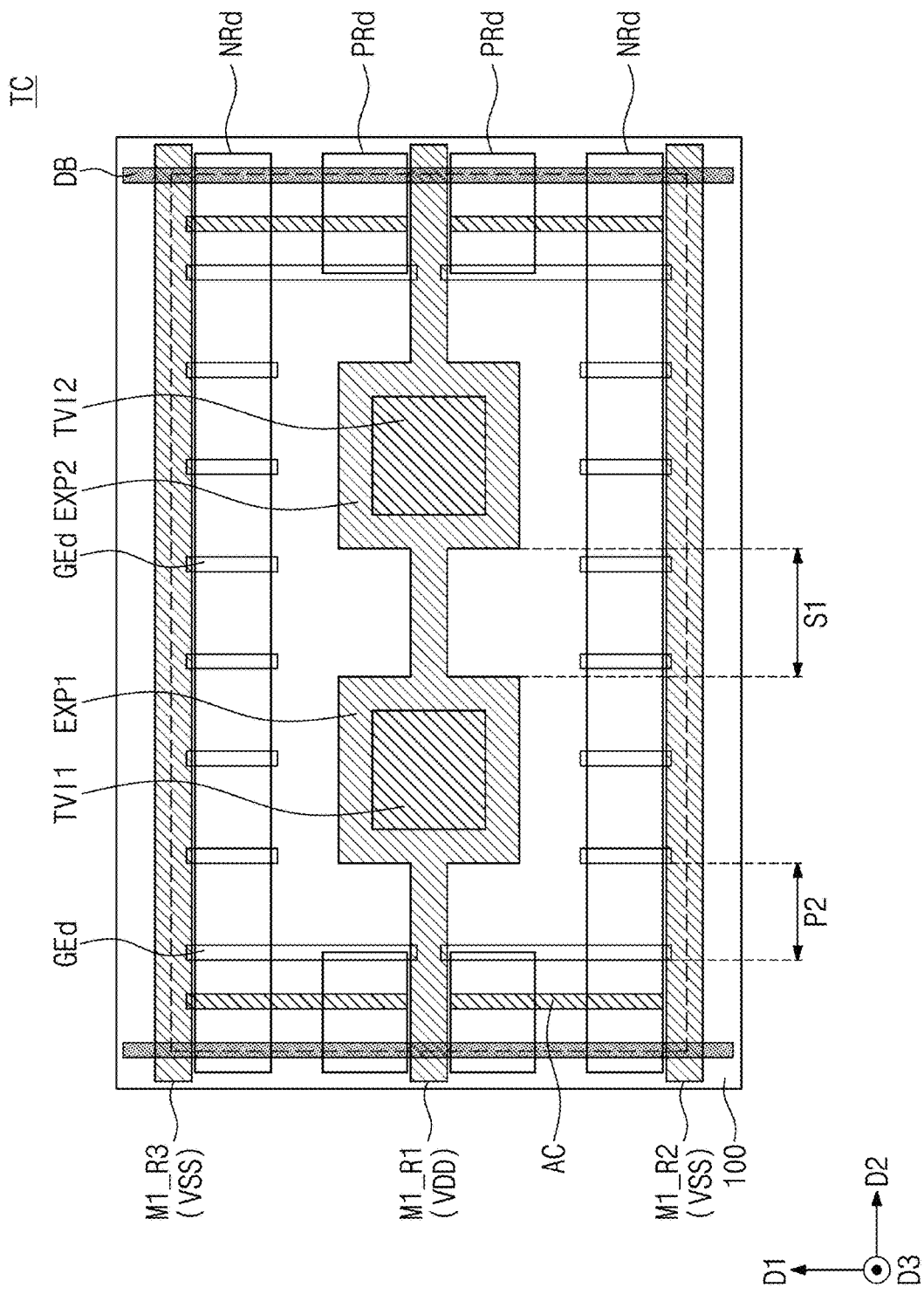
FIGS. 10 to 12 are plan views illustrating tap cells according to example embodiments.
Figure 11:
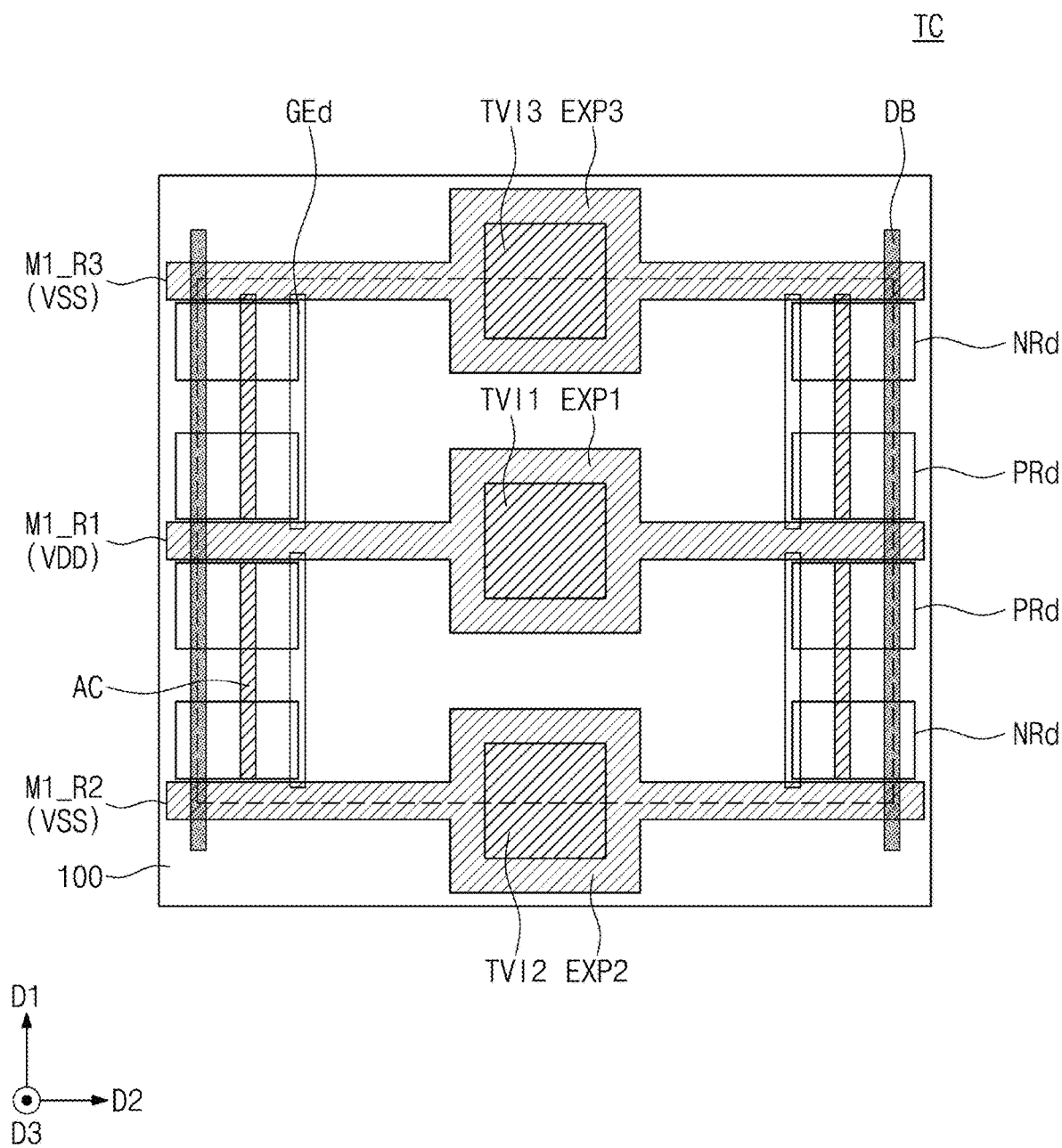
Figure 12:
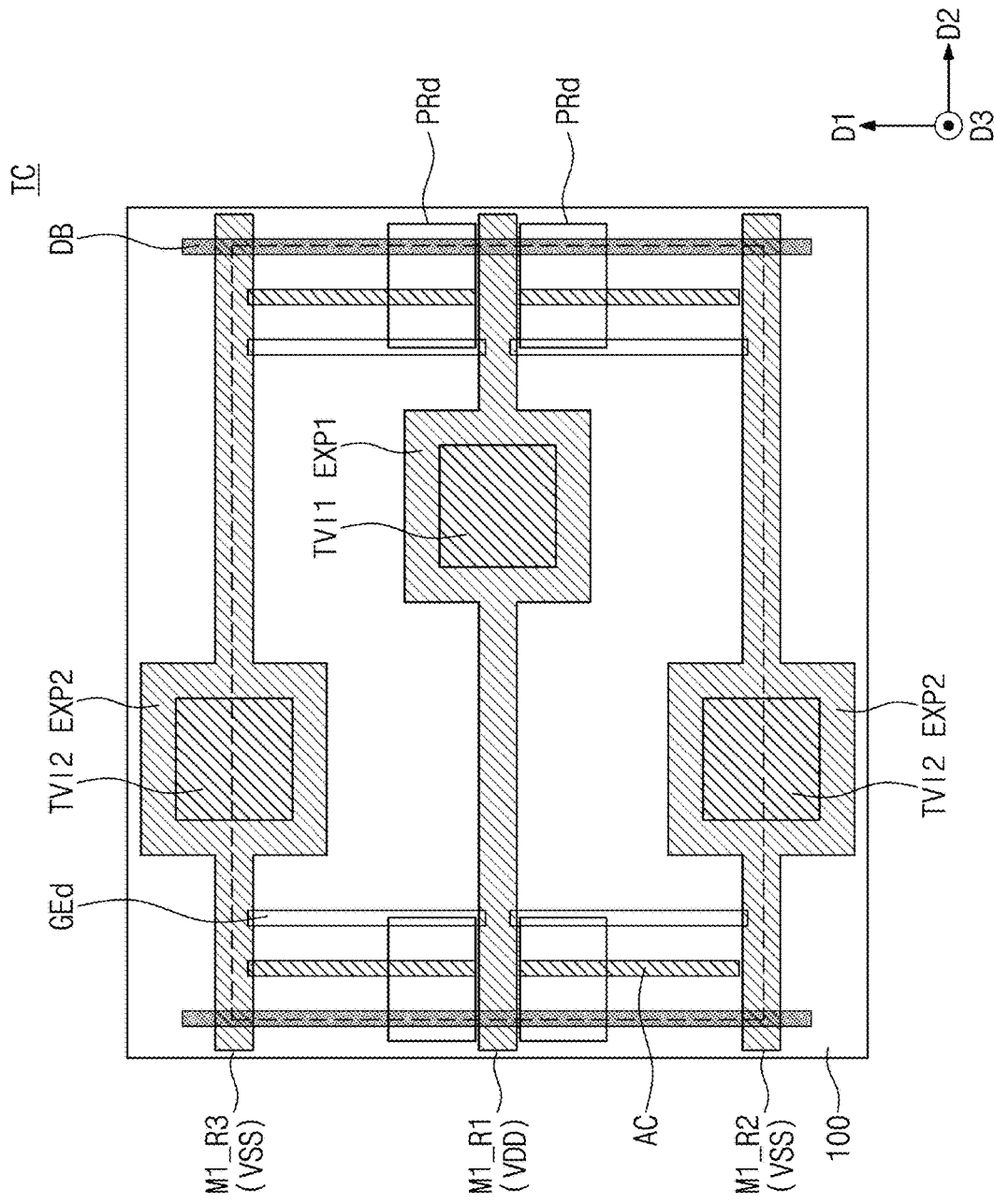

FIGS. 10 to 12 are plan views illustrating tap cells of FIG. 4 according to example embodiments. For concise description, an element previously described with reference to FIGS. 7, 8A, and 8B may be identified by the same reference number without repeating an overlapping description thereof Referring to FIG. 10, the first power line M1_R1 in the tap cell TC may include a first expanded portion EXP1 and a second expanded portion EXP2. The first expanded portion EXP1 and the second expanded portion EXP2 may be adjacent to each other in the second direction D2. As shown, the first expanded portion EXP1 and the second expanded portion EXP2 may have the same size. However, example embodiments are not limited thereto and the first expanded portion EXP1 and the second expanded portion EXP2 may have different sizes from each other.

A first through via TVI1 may be overlapped with the first expanded portion EXP1, and a second through via TVI2 may be overlapped with the second expanded portion EXP2. As illustrated in FIGS. 8A and 8B, the first through via TVI1 may connect the power delivery network PDN to the first expanded portion EXP1. Similarly, the second through via TVI2 may connect the power delivery network PDN to the second expanded portion EXP2. A first distance S1 between the first expanded portion EXP1 and the second expanded portion EXP2 may be 0.8 to 10 times the second pitch P2 between the dummy electrodes GEd.

Referring to FIG. 11, the first power line M1_R1, the second power line M1_R2, and the third power line M1_R3 in the tap cell TC may include the first expanded portion EXP1, the second expanded portion EXP2, and a third expanded portion EXP3, respectively. The first to third expanded portions EXP1, EXP2, and EXP3 may be aligned to each other in the first direction D1. The first through via TVI1, the second through via TVI2, and a third through via TVI3 may be overlapped with the first expanded portion EXP1, the second expanded portion EXP2, and the third expanded portion EXP3, respectively. The first to third power lines M1_R1, M1_R2, and M1_R3 may be connected to the power delivery network PDN through the first to third through vias TVI1, TVI2, and TVI3.

Referring to FIG. 12, at least two of the first to third expanded portions EXP1, EXP2, and EXP3 may not be arranged in a line in the first direction D1. For example, the second and third expanded portions EXP2 and EXP3 may be aligned to each other in the first direction D1, whereas the first expanded portion EXP1 may be offset from each of the second and third expanded portions EXP2 and EXP3 in the second direction D2. In other words, the first to third expanded portions EXP1, EXP2, and EXP3 may be arranged in a zigzag or staggered shape.

Figure 13:
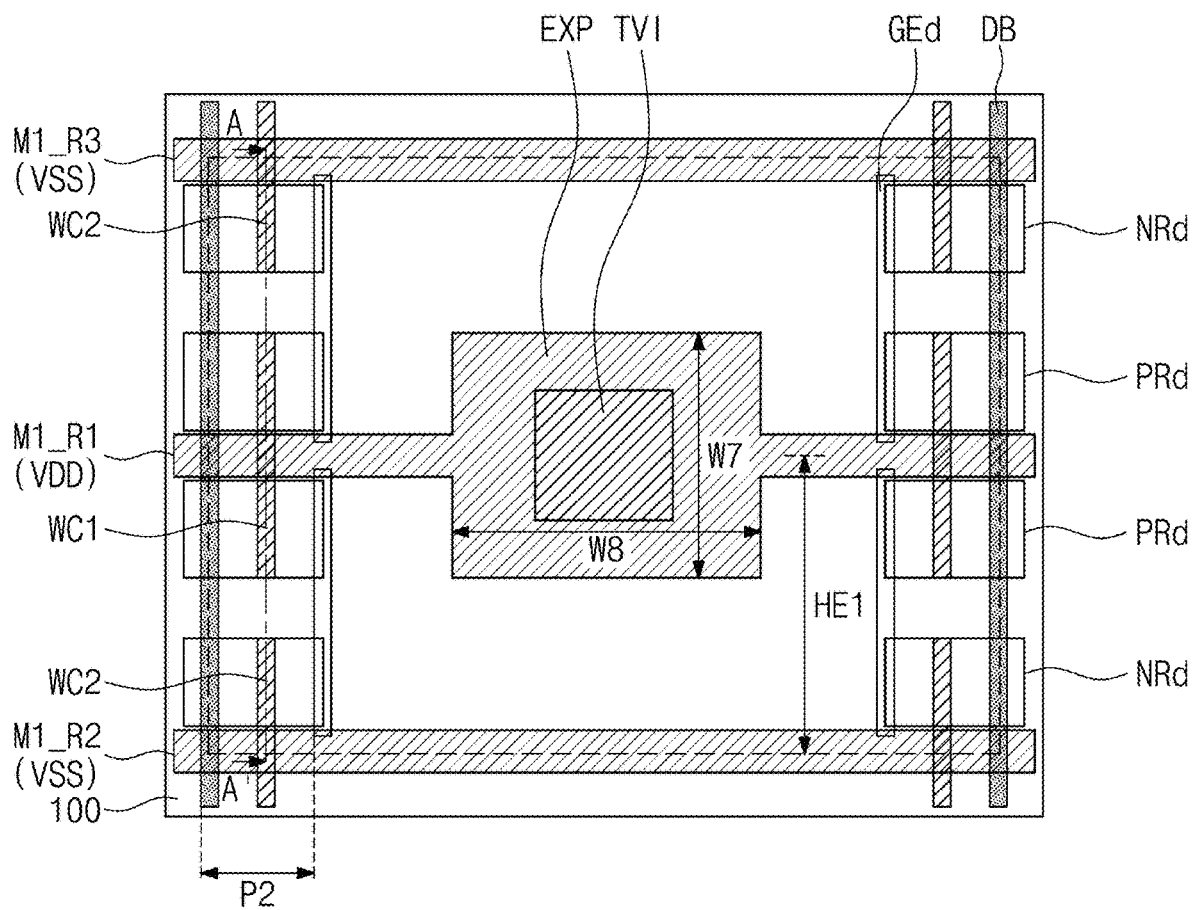
FIG. 13 is a plan view illustrating a detailed structure of the tap cell of FIG. 4, according to an example embodiment.
Figure 14:
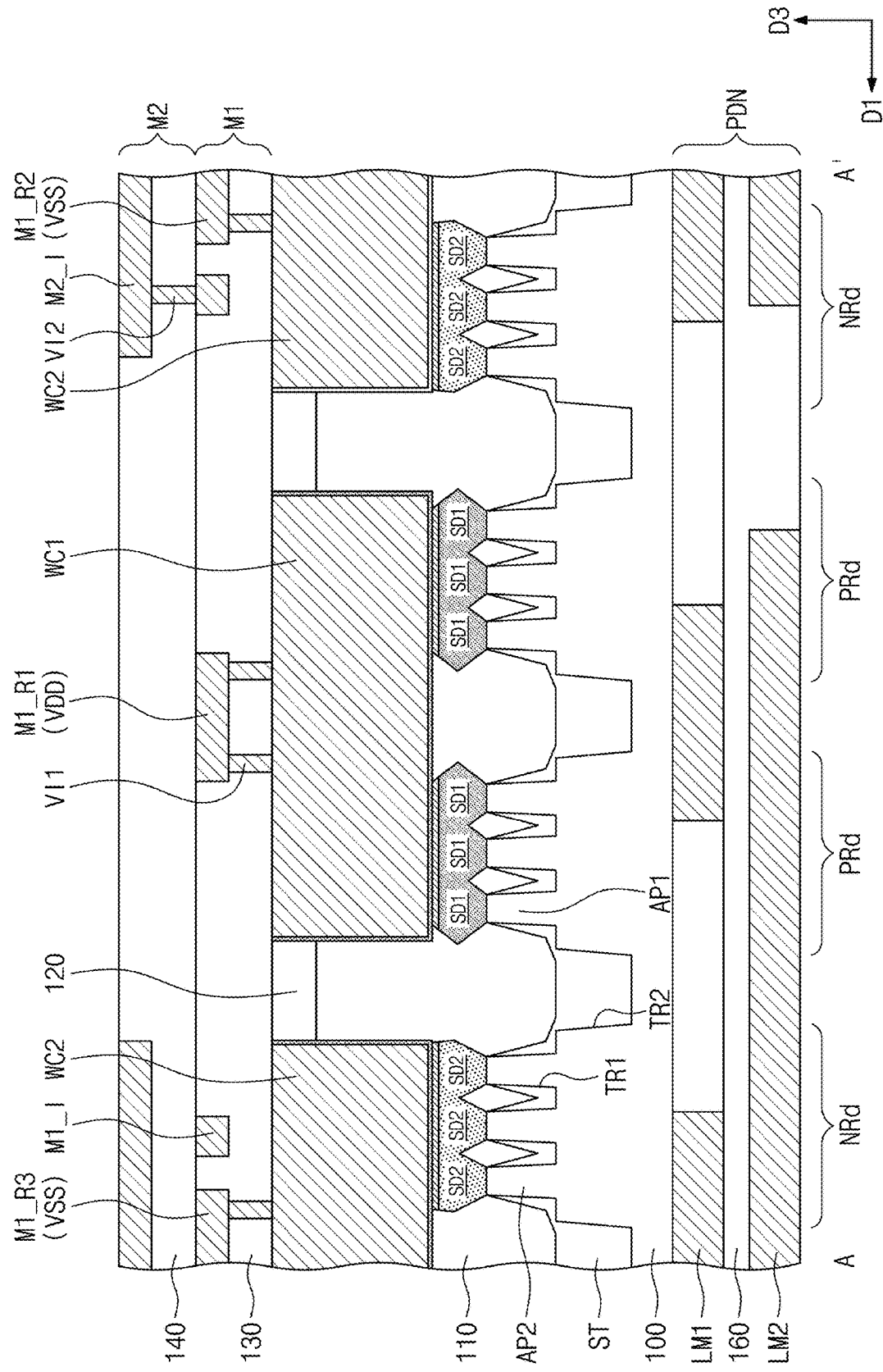
FIG. 14 is a sectional view taken along a line A-A' of FIG. 13 according to an example embodiment.

FIG. 13 is a plan view illustrating a detailed structure of the tap cell of FIG. 4, according to an example embodiment. FIG. 14 is a sectional view taken along a line A-A' of FIG. 13. For concise description, an element previously described with reference to FIGS. 7, 8A, and 8B may be identified by the same reference number without repeating an overlapping description thereof Referring to FIGS. 13 and 14, the expanded portion EXP of the first power line M1_R1 in the tap cell TC may have a seventh width W7 in the first direction D1 and an eighth width W8 in the second direction D2. The seventh width W7 and the eighth width W8 may be larger than the first width W1 and the second width W2, respectively, of FIG. 7.

As previously described with reference to FIG. 1, a distance between the first power line M1_R1 and the second power line M1_R2 may be the first height HE1. The seventh width W7 may be 0.7 to 0.9 times the first height HE1. In the case where the size of the expanded portion EXP is increased, the second dummy region NRd may be omitted from a region that is adjacent to the expanded portion EXP in the first direction D1. The eighth width W8 may be 2.5 to 4 times the second pitch P2 between the dummy electrodes GEd.

A first well contact WC1 may be provided on the first dummy region PRd, and a second well contact WC2 may be provided on the second dummy region NRd. Each of the first and second well contacts WC1 and WC2 may be provided to have substantially the same structure and position as the active contact AC described above. Each of the first and second well contacts WC1 and WC2 may be used to applied to apply a voltage to a well region, and in this sense, the well contacts WC1 and WC2 may differ from the active contact AC in terms of their function.

The first well contact WC1 may be disposed below the first power line M1_R1 and may extend in the first direction D1. The first power line M1_R1 and the first well contact WC1 may be connected to each other through at least one first via VD disposed therebetween. As a result, a voltage from the first power line M1_R1 may be applied to the well region in the substrate 100 through the first well contact WC1, the first source/drain patterns SD1, and the first active patterns AP1.

Each of the first dummy regions PRd may be, for example, a PMOSFET region. The first source/drain patterns SD1 on the first dummy region PRd may have an n-type. The first active patterns AP1 and the substrate 100, which are located below the first source/drain patterns SD1, may be an impurity region serving as an n-well. The drain voltage VDD from the power delivery network PDN may be applied to the first power line M1_R1 through the through via TVI, and then, the drain voltage VDD from the first power line M1_R1 may be applied to the n-well through the first well contact WC1.

The second well contact WC2 may be disposed below the second power line M1_R2 or the third power line M1_R3 and may extend in the first direction D1. Each of the second and third power lines M1_R2 and M1_R3 may be connected to the second well contact WC2 through the first via VI1. A voltage from each of the second and third power lines M1_R2 and M1_R3 may be applied to the well region in the substrate 100 through the second well contact WC2, the second source/drain patterns SD2, and the second active patterns AP2.

For example, each of the second dummy regions NRd may be an NMOSFET region. The second source/drain patterns SD2 on the second dummy region NRd may be of the p-type. The second active patterns AP2 and the substrate 100, which are located below the second source/drain patterns SD2, may be an impurity region serving as a p-well. The source voltage VSS from each of the second and third power lines M1_R2 and M1_R3 may be applied to the p-well through the first well contact WC1.

The tap cell TC may include not only the power tap cell, which is configured to apply a voltage from the power delivery network PDN to the power line of the first metal layer Ml, but also the well tap cell, which is configured to apply a voltage from the power line of the first metal layer M1 to the well region. That is, the tap cell TC may be a hybrid tap cell, in which the power tap and the well tap are combined.

Figure 15:
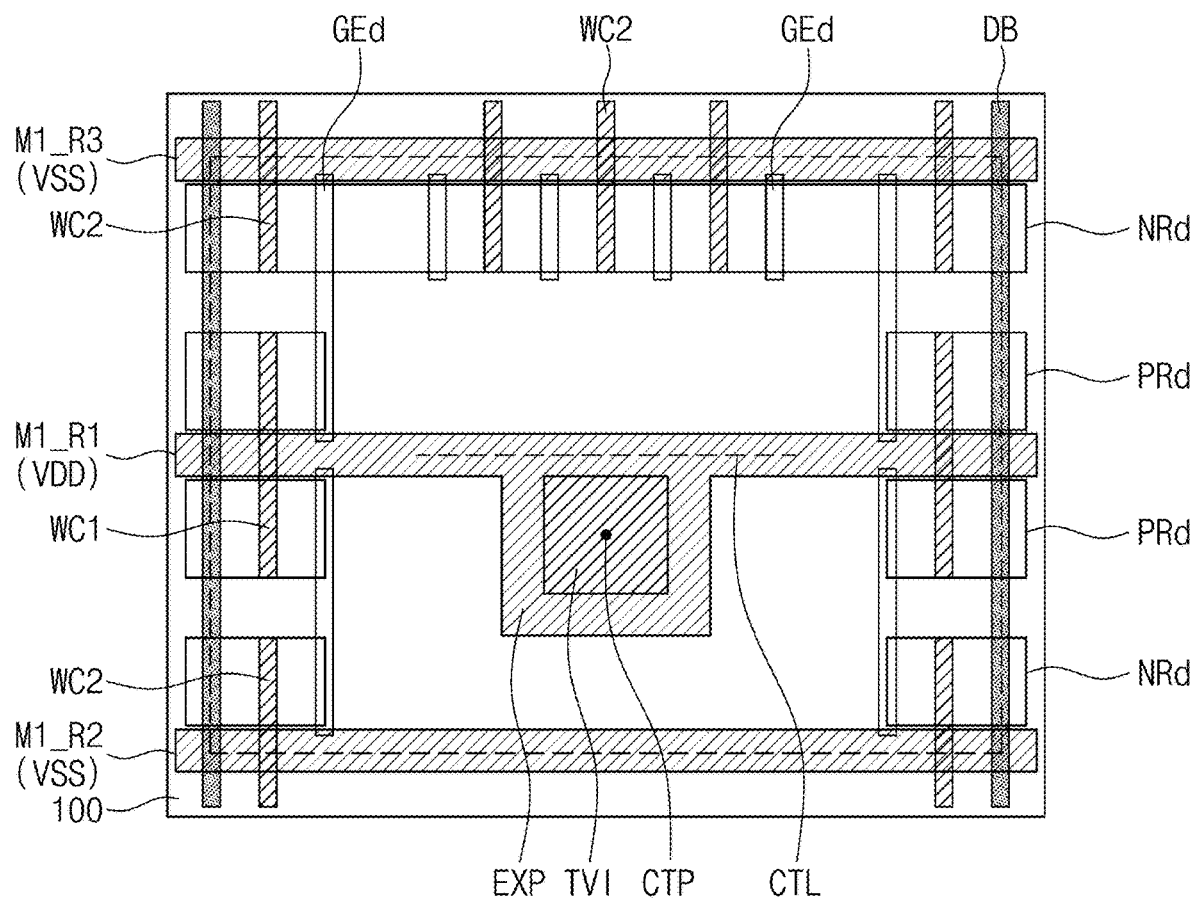
FIGS. 15 to 17 are plan views illustrating hybrid tap cells of FIG. 13 according to example embodiments.
Figure 16:
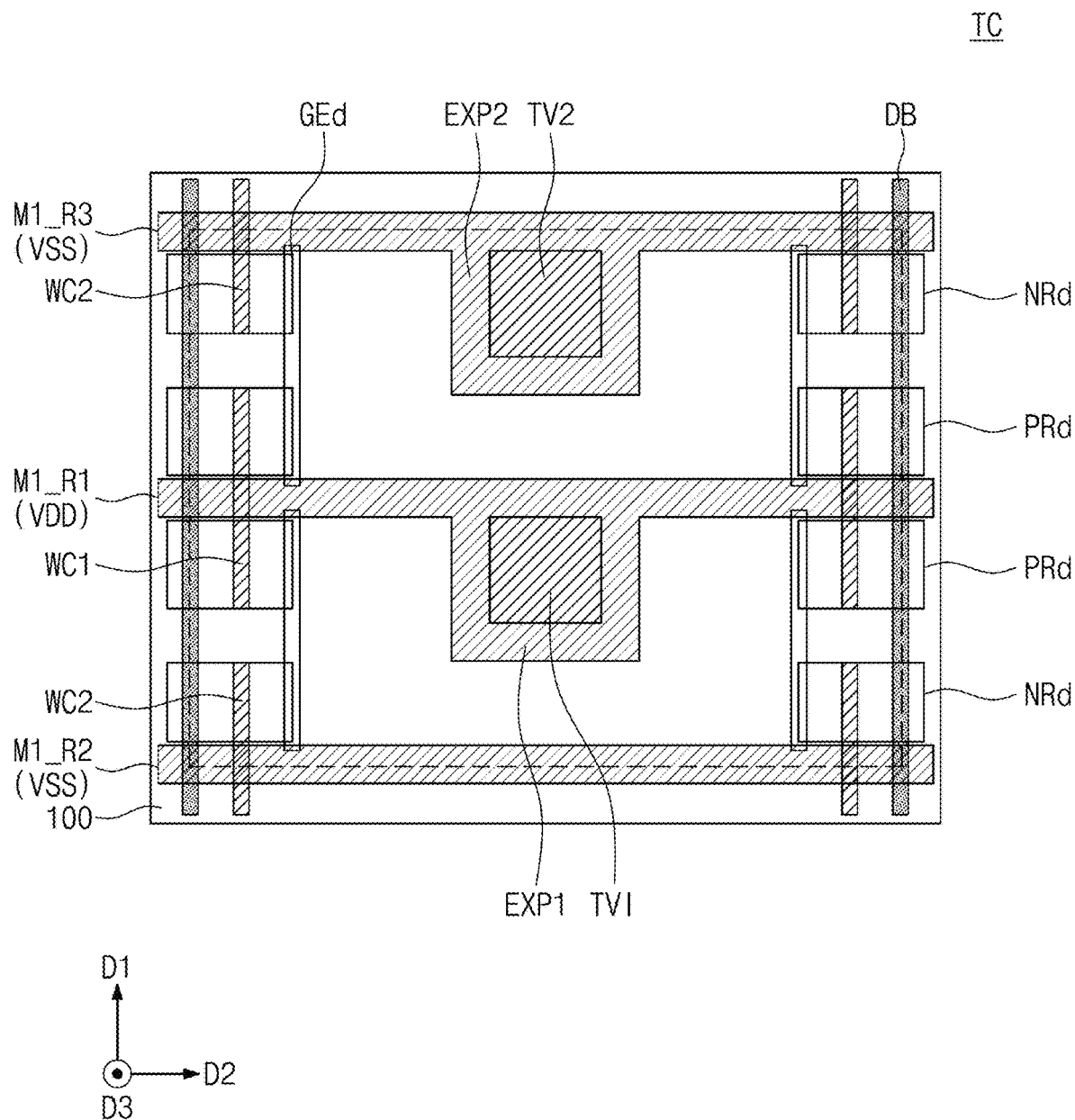
Figure 17:
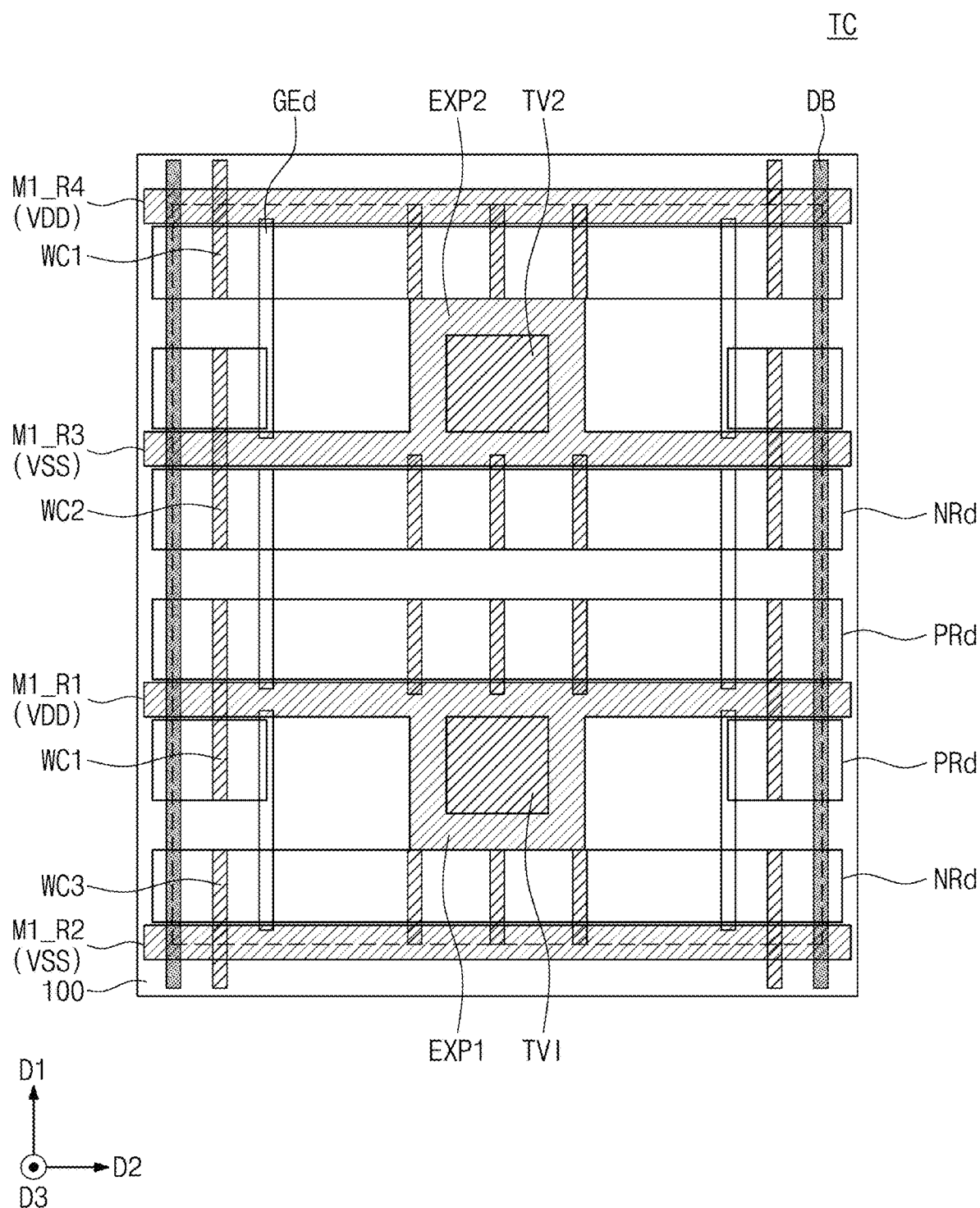

FIGS. 15 to 17 are plan views illustrating examples of hybrid tap cell of FIG. 13 according to example embodiments. Referring to FIG. 15, the expanded portion EXP may have a shape protruding from the first power line M1_R1 toward the second power line M1_R2. The expanded portion EXP may be provided in a region between the first power line M1_R1 and the second power line M1_R2. A center line CTL of the first power line M1_R1 may be offset from a center point CTP of the expanded portion EXP in the first direction D1. The through via TVI may be overlapped with the expanded portion EXP. The through via TVI may not be overlapped with the center line CTL of the first power line M1_R1 and may be offset from the center line CTL.

Because the expanded portion EXP is provided at a position closer to the second power line M1_R2, a distance from the second dummy region NRd adjacent to the third power line M1_R3 to the through via TVI may be increased. Thus, the second dummy region NRd, which is adjacent to the third power line M1_R3, may continuously extend in the second direction D2 between division structures DB, without a region cut by the expanded portion EXP. The second well contacts WC2 may be provided on the second dummy region NRd, which is adjacent to the third power line M1_R3. The additional second well contacts WC2 lower the resistance between the third power line M1_R3 and the well region in the substrate 100.

Referring to FIG. 16, the first power line M1_R1 may include the first expanded portion EXP1 protruding toward the second power line M1_R2, and the third power line M1_R3 may include the second expanded portion EXP2 protruding toward the first power line M1_R1. The first through via TVI1 and the second through via TVI2 may be overlapped with the first expanded portion EXP1 and the second expanded portion EXP2, respectively.

Referring to FIG. 17, the tap cell TC may be a triple height cell, which is provided on first to fourth power lines M1_R1-M1_R4. The first power line M1_R1 may include the first expanded portion EXP1 protruding toward the second power line M1_R2, and the third power line M1_R3 may include the second expanded portion EXP2 protruding toward the fourth power line M1_R4. The first through via TVI1 and the second through via TVI2 may be overlapped with the first expanded portion EXP1 and the second expanded portion EXP2, respectively.

The tap cell TC may be configured not only to apply a voltage from the power delivery network PDN to the power line but also to apply a voltage from the power line to the well region in the substrate 100. Because one tap cell TC includes two different cells (i.e., the power tap cell and the well tap cell), an integration density of the semiconductor device may be increased.

Figure 18:
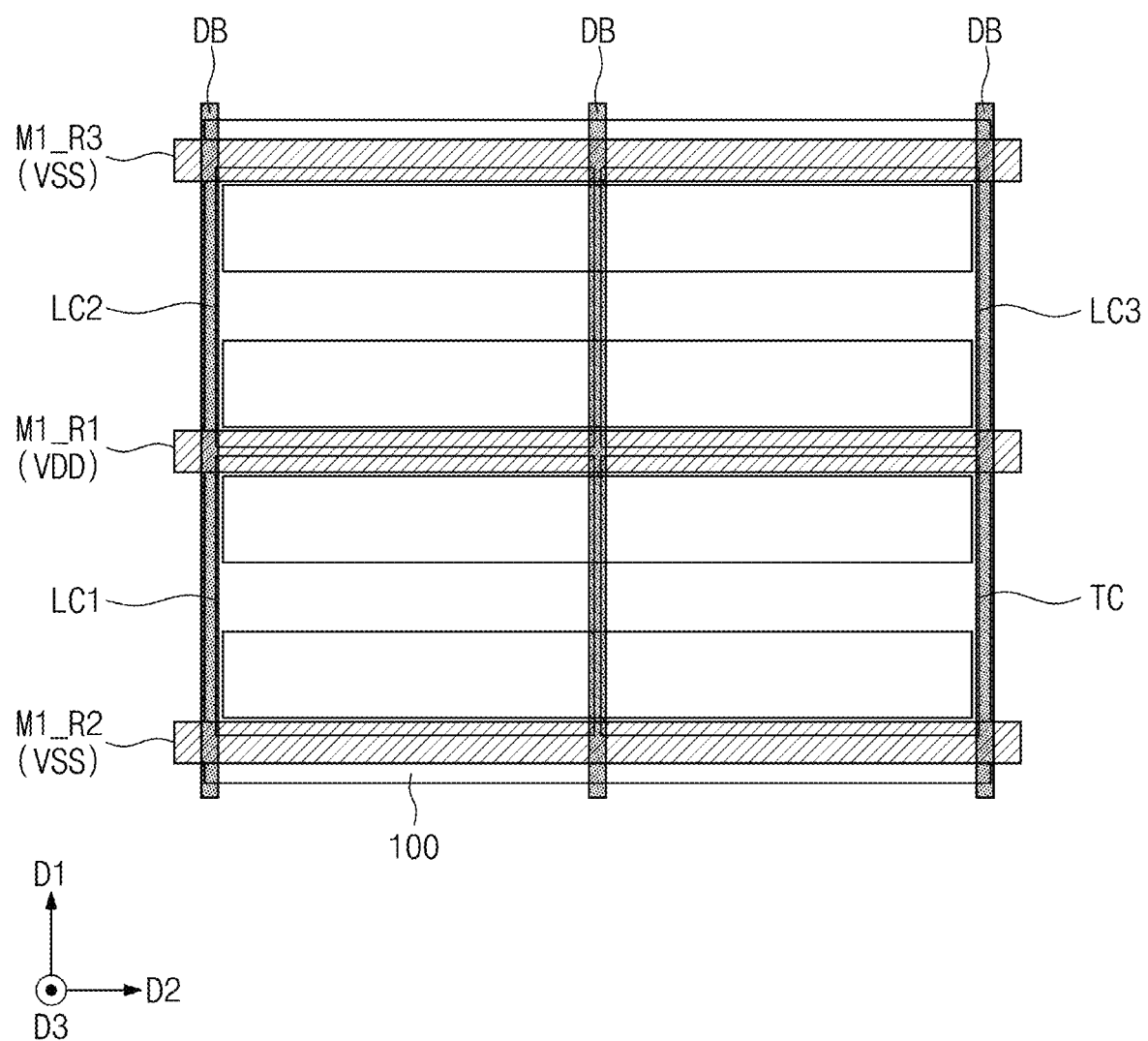
FIG. 18 is a plan view illustrating logic cells and a tap cell in a semiconductor device according to an example embodiment.

FIG. 18 is a plan view illustrating logic cells and a tap cell in a semiconductor device according to an example embodiment. Referring to FIG. 18, the first logic cell LC1, the second logic cell LC2, a third logic cell LC3, and the tap cell TC may be two-dimensionally disposed on the substrate 100. In detail, each of the first to third logic cells LC1, LC2, and LC3 may be the single height cell. The tap cell TC may be the single height cell. The tap cell TC may be disposed on the first and second power lines M1_R1 and M1_R2. The tap cell TC may be adjacent to the first logic cell LC1 in the second direction D2.

Figure 19:
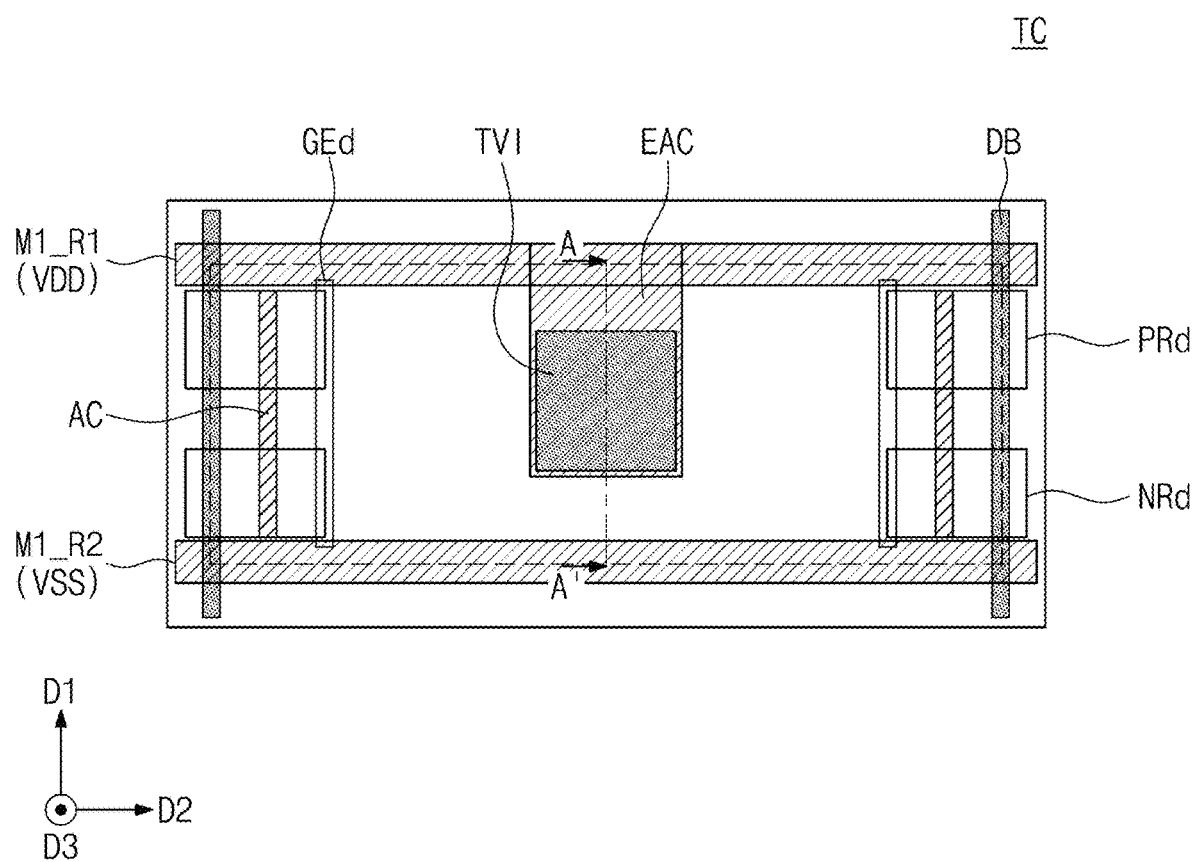
FIG. 19 is a plan view illustrating a detailed structure of the tap cell of FIG. 18, according to an example embodiment.
Figure 20:
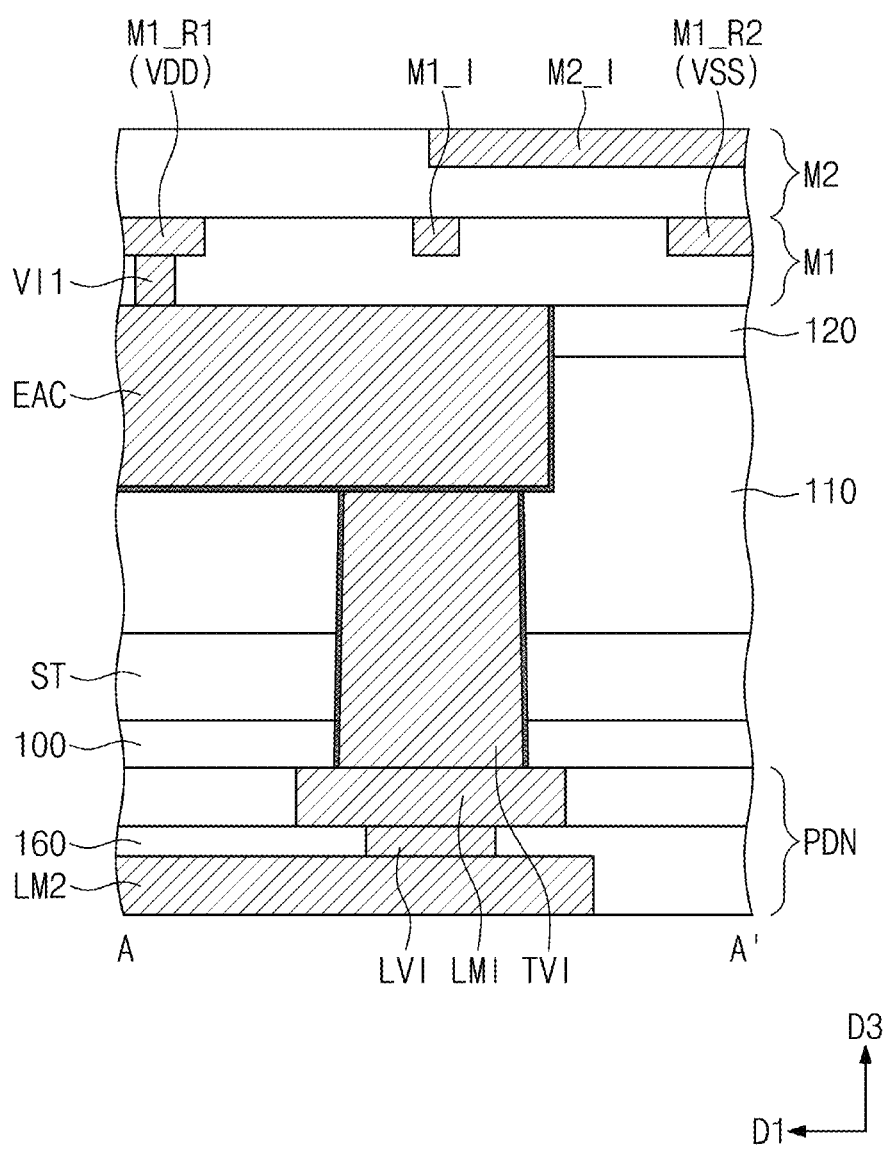
FIG. 20 is a sectional view taken along a line A-A' of FIG. 19 according to an example embodiment.

FIG. 19 is a plan view illustrating a detailed structure of the tap cell of FIG. 18, according to an example embodiment. FIG. 20 is a sectional view taken along a line A-A' of FIG. 19. For concise description, an element previously described with reference to FIGS. 7, 8A, and 8B may be identified by the same reference number without repeating an overlapping description thereof.

Referring to FIGS. 19 and 20, the tap cell TC may be a single height tap cell, in contrast to the double height tap cell previously described with reference to FIG. 7. An expanded contact EAC may be provided between the first power line M1_R1 and the device isolation layer ST. The expanded contact EAC may extend from the first power line M1_R1 toward the second power line M1_R2.

The expanded contact EAC may be provided at the same level as the active contact AC described above. For example, the expanded contact EAC may be formed along with the active contact AC. When viewed in a plan view, the expanded contact EAC may have a width or size that is larger than that of the active contact AC.

The through via TVI may be overlapped with the expanded contact EAC. The through via TVI may extend from the power delivery network PDN to a bottom surface of the expanded contact EAC. The expanded contact EAC and the power delivery network PDN may be connected to each other through the through via TVI. The first power line M1_R1 on the expanded contact EAC may be connected to the expanded contact EAC through the first via VI1. As a result, a voltage from the power delivery network PDN may be applied to the first power line M1_R1.

In the tap cell TC, a voltage from the power delivery network PDN may not be directly applied to the power line of the first metal layer M1. In the tap cell TC, the voltage may be applied to the power line through the expanded contact EAC and the first via VI1. In the tap cell TC, it may be possible to effectively apply a voltage from the power delivery network PDN to the power line, although the tap cell TC has a relatively small cell size (i.e., the single height, not the double height).

Figure 21:
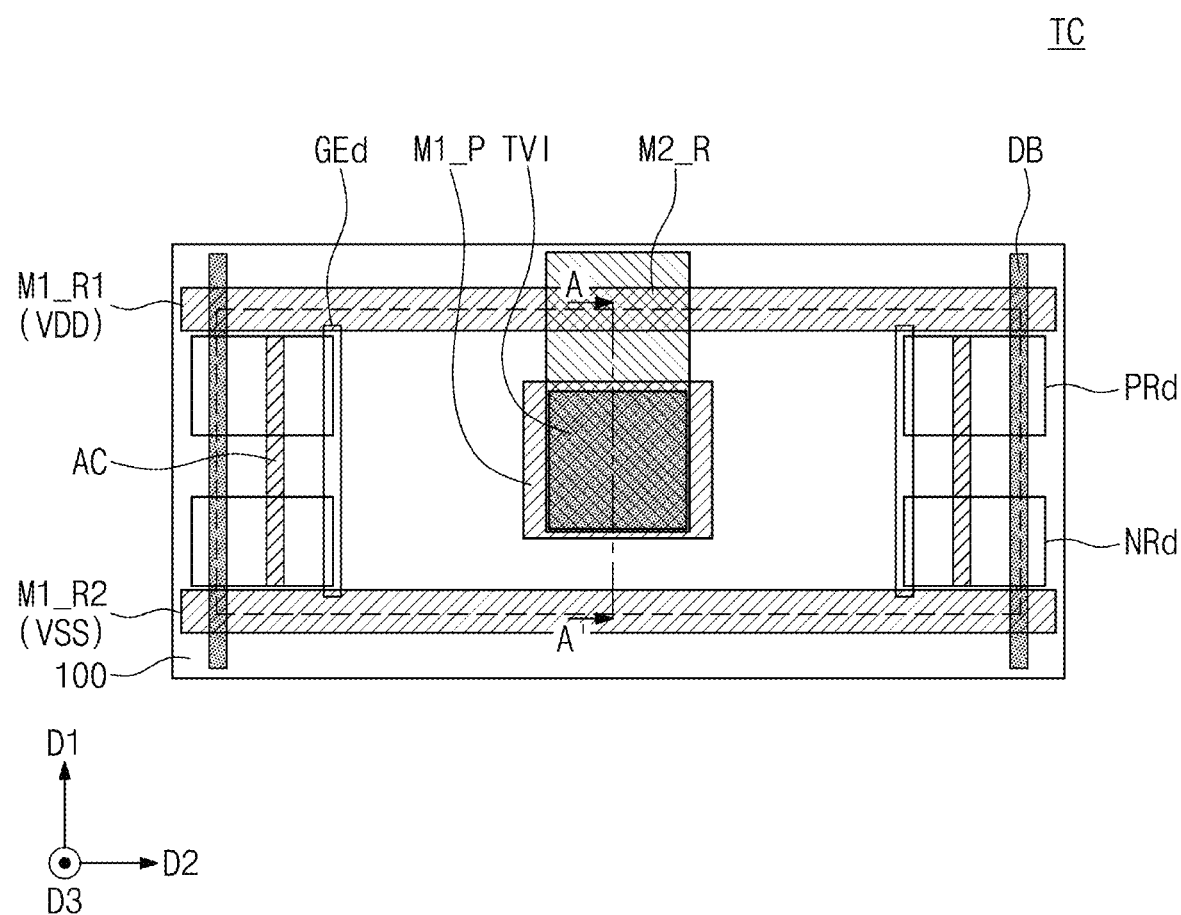
FIG. 21 is a plan view illustrating a detailed structure of the tap cell of FIG. 18, according to an example embodiment.
Figure 22:
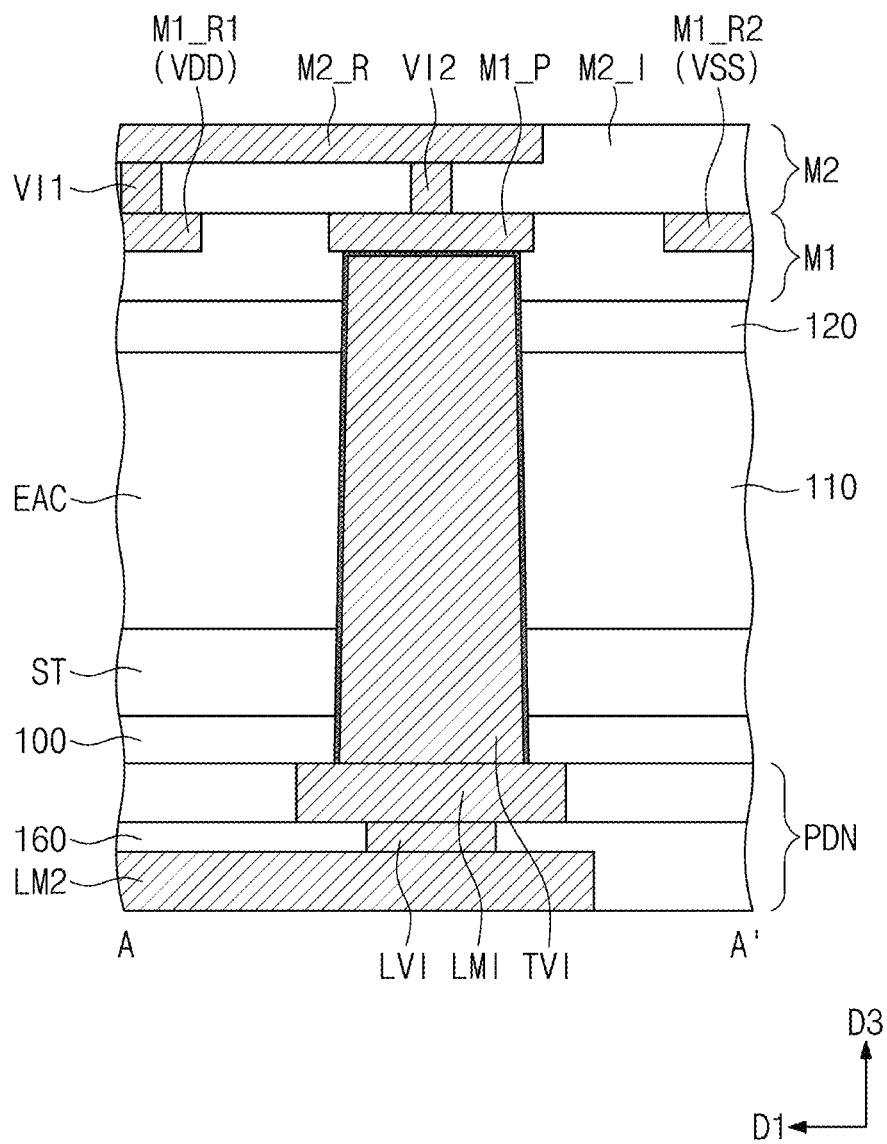
FIG. 22 is a sectional view taken along a line A-A' of FIG. 21 according to an example embodiment.

FIG. 21 is a plan view illustrating a detailed structure of the tap cell of FIG. 18, according to an example embodiment. FIG. 22 is a sectional view taken along a line A-A' of FIG. 21. Referring to FIGS. 21 and 22, the first metal layer M1 may include a pad M1_P, which is disposed between the first and second power lines M1_R1 and M1_R2. The through via TVI may be overlapped with the pad M1_P. The through via TVI may extend from the power delivery network PDN to a bottom surface of the pad M1_P. The pad M1_P and the power delivery network PDN may be connected to each other through the through via TVI.

The second metal layer M2 may include an upper power line M2_R, which is provided on the pad M1_P and extends to a region on the first power line M1_R1. The upper power line M2_R may be connected to the pad M1_P through the second via VI2. The upper power line M2_R may also be connected to the first power line M1_R1 through another one of the second vias VI2. In other words, the upper power line M2_R may be used as a bridge connecting the pad M1_P to the first power line M1_R1. As a result, a voltage from the power delivery network PDN may be applied to the first power line M1_R1.

Figure 23:
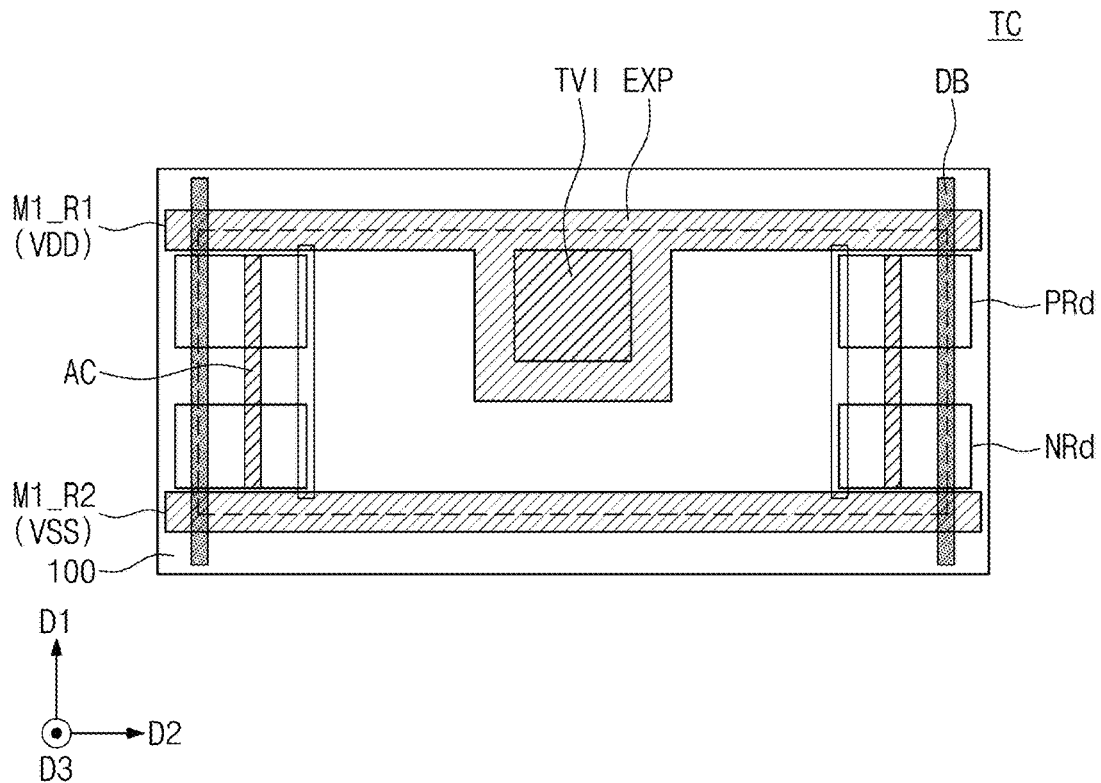
FIG. 23 is a plan view illustrating a detailed structure of the tap cell of FIG. 18, according to an example embodiment.

FIG. 23 is a plan view illustrating a detailed structure of the tap cell of FIG. 18, according to an example embodiment. Referring to FIG. 23, the first power line M1_R1 may include the expanded portion EXP protruding toward the second power line M1_R2. The through via TVI may be overlapped with the expanded portion EXP. The expanded portion EXP of the first power line M1_R1 and the through via TVI may be substantially the same as the expanded portion EXP of the first power line M1_R1 and the through via TVI, previously described with reference to FIG. 15.

Figure 24:
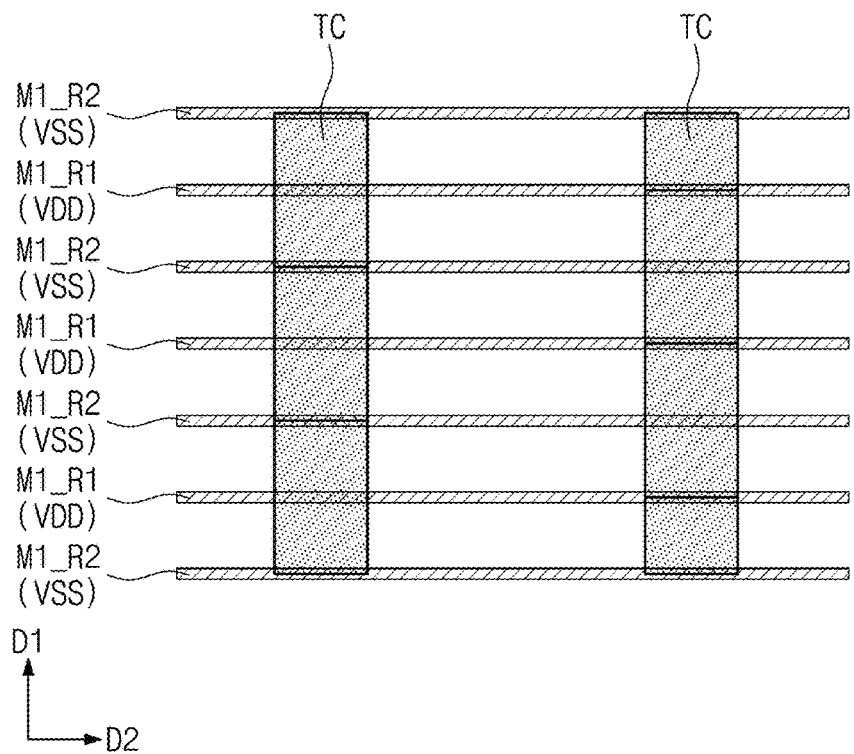
FIGS. 24 and 25 are plan views illustrating a method of designing a semiconductor device, according to an example embodiment.
Figure 25:
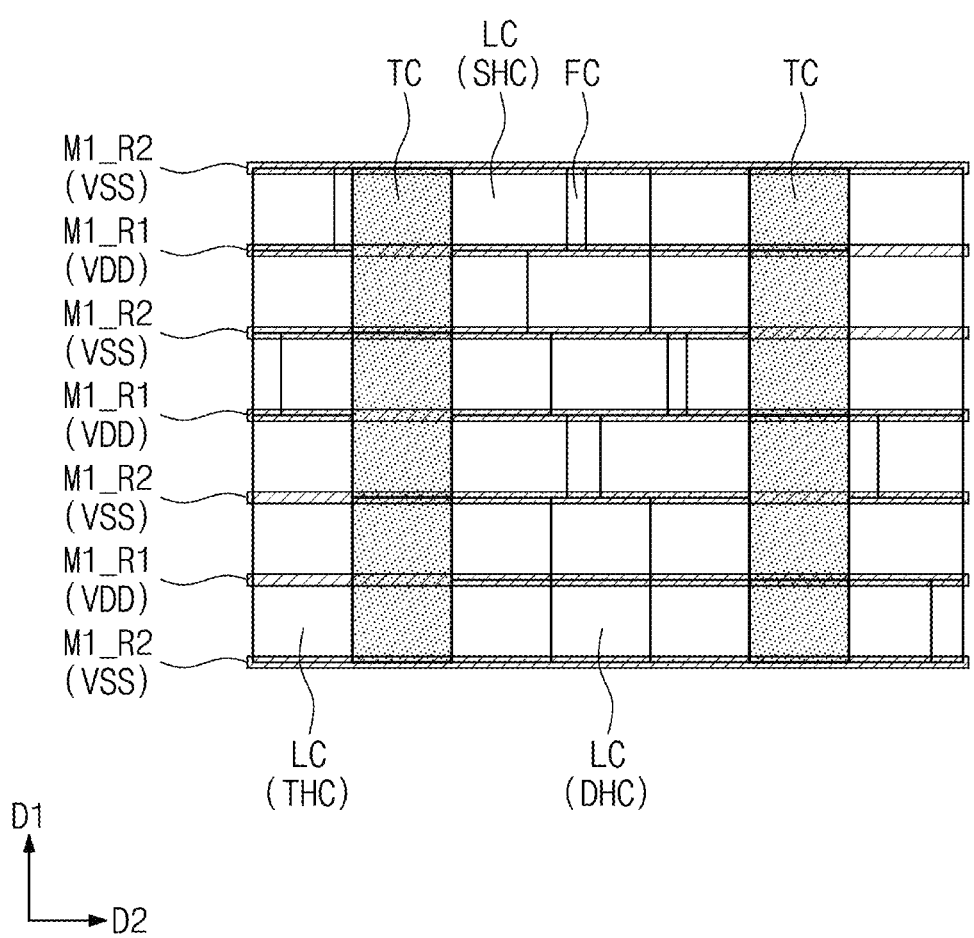

FIGS. 24 and 25 are plan views illustrating a method of designing a semiconductor device, according to an example embodiment. Referring to FIG. 24, the semiconductor device according to an example embodiment may be fabricated based on a designed layout. The layout of the semiconductor device may be generated using a layout design tool.

In detail, the power lines M1_R1 and M1_R2 may be placed on the layout. The power lines M1_R1 and M1_R2 may include the first power line M1_R1 defining a conduction path of the drain voltage VDD and the second power line M1_R2 defining a conduction path of the source voltage VSS. The first and second power lines M1_R1 and M1_R2 may be alternately arranged with a specific pitch in the first direction D1.

The tap cells TC may be placed on the first and second power lines M1_R1 and M1_R2. The tap cells TC may be disposed at positions required for a stable voltage supply to the first and second power lines M1_R1 and M1_R2.

Referring to FIG. 25, the logic cells LC and filler cells FC may be placed on the first and second power lines M1_R1 and M1_R2. The logic cells LC may be placed on a remaining region, in which the tap cells TC are not disposed. The logic cells LC may be placed on the layout, based on the designed circuit. As an example, the logic cells LC may include at least one single height cell SHC, at least one double height cell DHC, and at least one triple height cell THC. The filler cell FC may fill an empty space between the logic cells LC. The filler cell FC may be a dummy cell.

If the placement of the logic cells LC is finished, a routing operation may be performed to connect the logic cells LC to each other. A mask for each layer may be manufactured based on the routing-completed layout and then may be used to realize the semiconductor device on a substrate.

Figure 26:
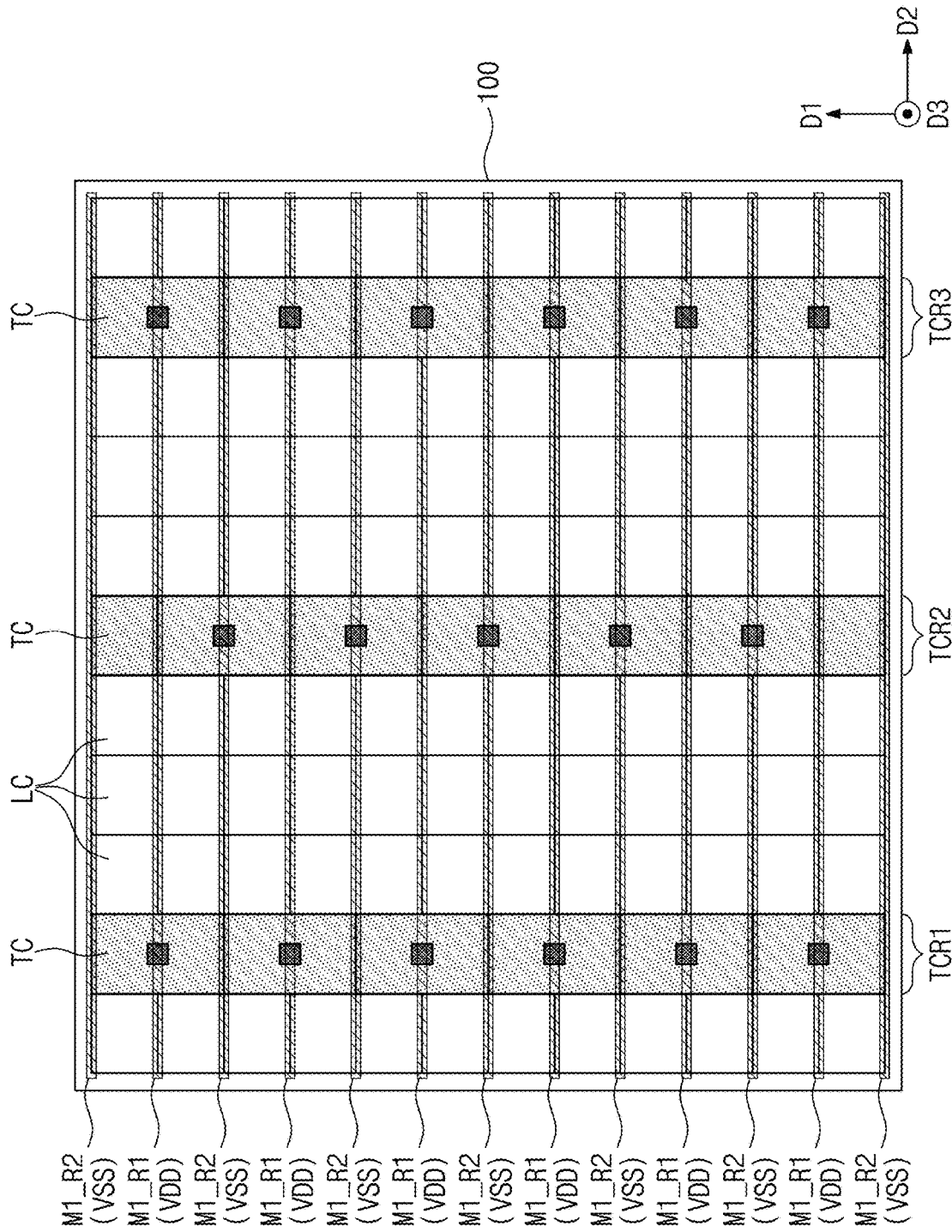
FIGS. 26 to 28 are plan views, each of which illustrates a relative arrangement of tap cells and logic cells in a semiconductor device according to example embodiments.
Figure 27:
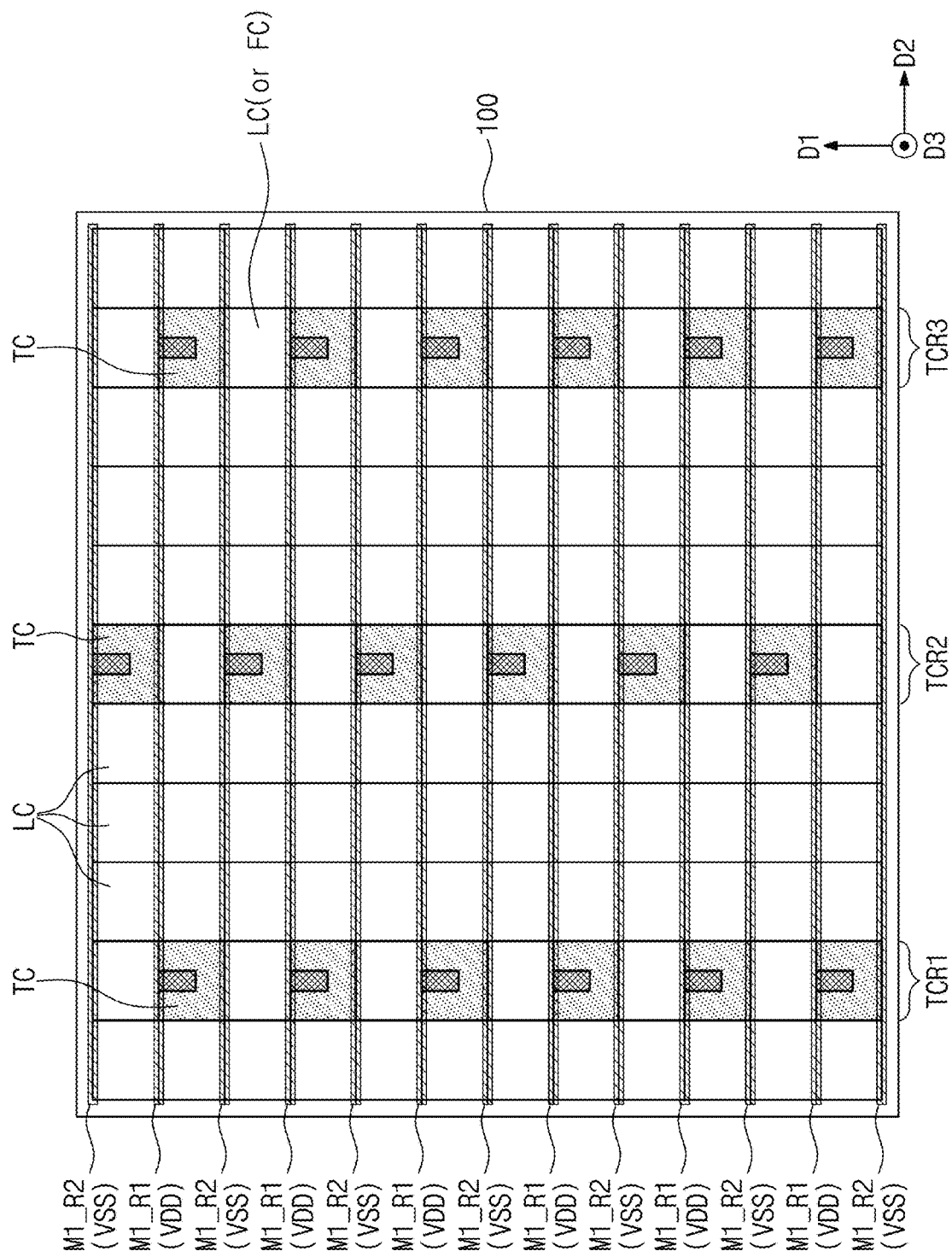
Figure 28:
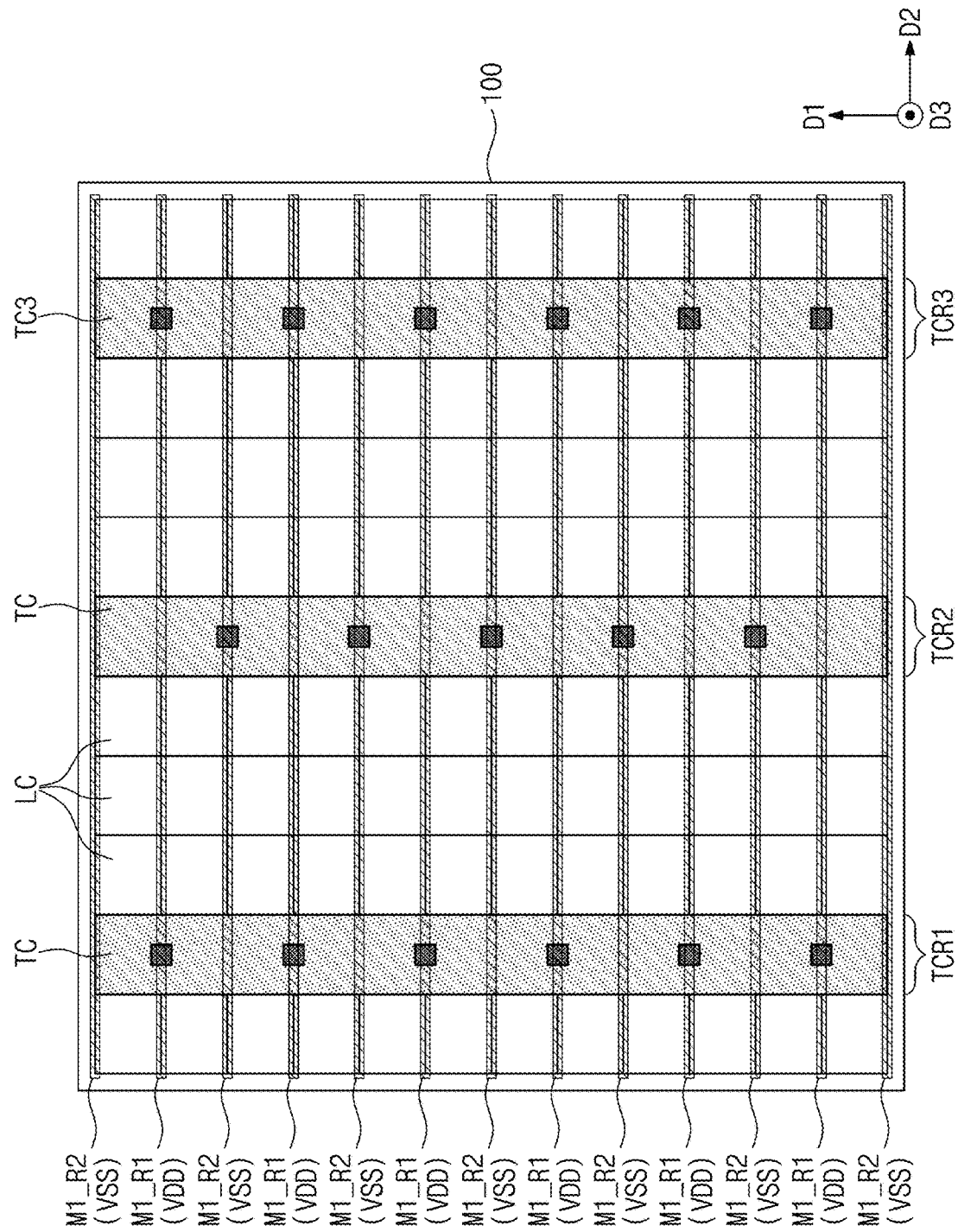

FIGS. 26 to 28 are plan views, each of which illustrates the relative arrangement of tap cells and logic cells in a semiconductor device according to example embodiments.

Referring to FIG. 26, the first and second power lines M1_R1 and M1_R2 may be alternately arranged in the first direction D1, on the substrate 100. A first tap cell track TCR1, a second tap cell track TCR2, and a third tap cell track TCR3 may be defined on the substrate 100. Each of the first to third tap cell tracks TCR1, TCR2, and TCR3 may extend in the first direction D1. The first to third tap cell tracks TCR1, TCR2, and TCR3 may be arranged with a uniform pitch in the second direction D2.

The tap cells TC may be arranged in the first direction D1, on each of the first to third tap cell tracks TCR1, TCR2, and TCR3. Each of the tap cells TC may include, for example, the tap cell TC of FIG. 7 or the hybrid tap cell TC of FIG. 13.

The tap cells TC of the first tap cell track TCR1 may be configured to apply a voltage from the power delivery network PDN to the first power lines M1_R1. The tap cells TC of the second tap cell track TCR2 may be configured to apply a voltage from the power delivery network PDN to the second power lines M1_R2. The tap cells TC of the third tap cell track TCR3 may be configured to apply a voltage from the power delivery network PDN to the first power lines M1_R1. However, example embodiments are not limited thereto and, for example, the tap cells TC of the third tap cell track TCR3 may be configured to apply a voltage from the power delivery network PDN to another group of power lines, such as third power lines M1_R3.

Referring to FIG. 27, the tap cells TC may be arranged in the first direction D1, on each of the first to third tap cell tracks TCR1, TCR2, and TCR3. Each of the tap cells TC may be the single height cell and may be, for example, the tap cell TC of FIG. 19, 21, or 23. On each of the first to third tap cell tracks TCR1, TCR2, and TCR3, the logic cell LC or the filler cell FC may be interposed between the tap cells TC, which are adjacent to each other in the first direction D1.

Referring to FIG. 28, the tap cells TC, which extend in the first direction D1, may be disposed on each of the first to third tap cell tracks TCR1, TCR2, and TCR3. The tap cells TC may be the multi height cell and may include, for example, the tap cell TC of FIG. 17.

Figure 29A:
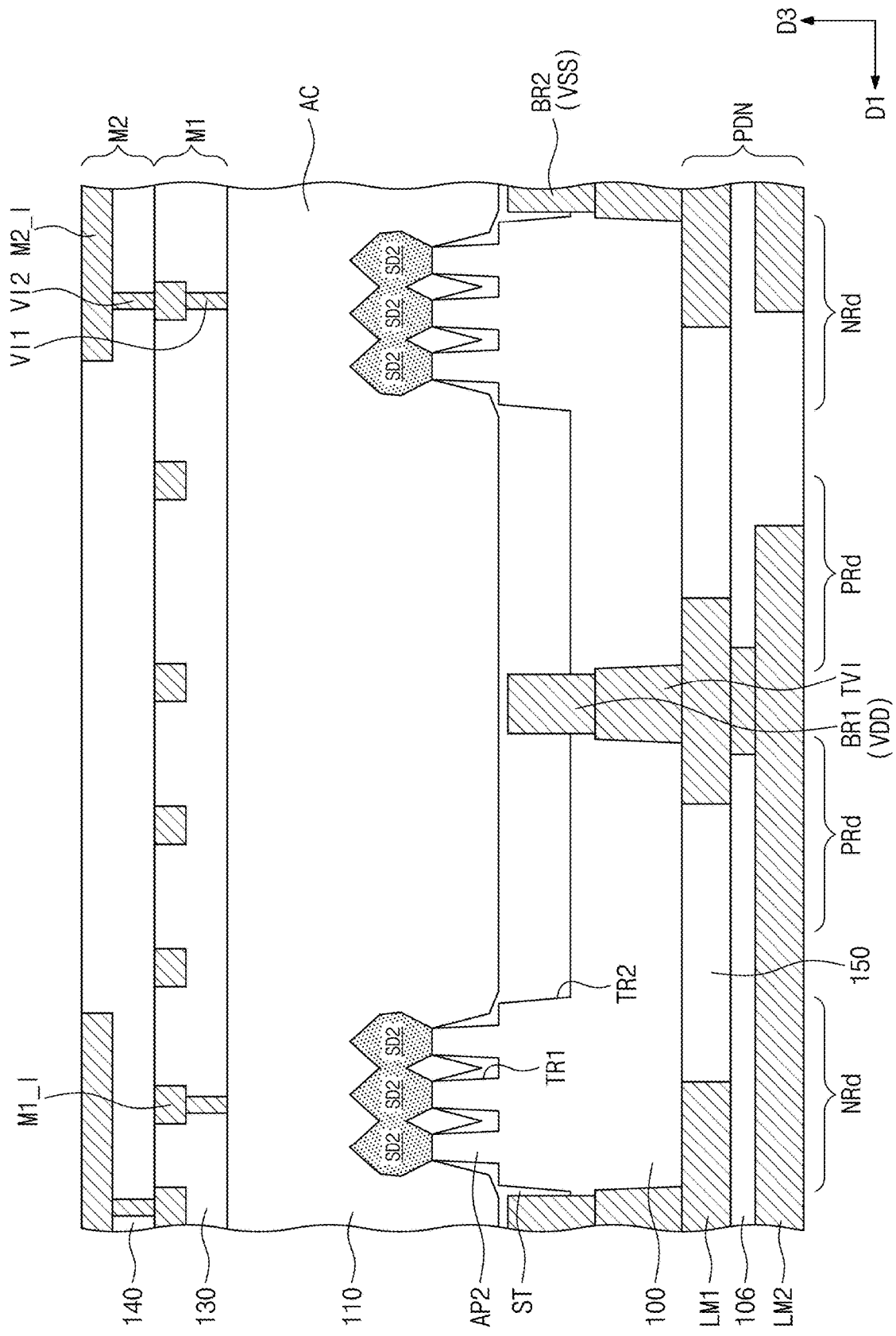
FIGS. 29A and 29B are sectional views illustrating a semiconductor device according to example embodiments.

FIG. 29A is a sectional view illustrating a tap cell of a semiconductor device according to an example embodiment. Referring to FIG. 29A, the power lines may be omitted from the first metal layer M1. Buried power lines BR1 and BR2 may be provided in the substrate 100. The buried power lines BR1 and BR2 may include a first buried power line BR1, to which the drain voltage VDD is provided, and a second buried power line BR2, to which the source voltage VSS is provided.

Each of the first and second buried power lines BR1 and BR2 may include a lower portion, which is buried in the substrate 100, and an upper portion, which is buried in the device isolation layer ST filling the second trench TR2.

The tap cell TC of FIG. 29A may include through vias TVI, which are respectively extended from the power delivery network PDN to the first and second buried power lines BR1 and BR2. The first lower interconnection lines LM1 may be electrically connected to the first and second buried power lines BR1 and BR2, respectively, through the through vias TVI.

Figure 29B:
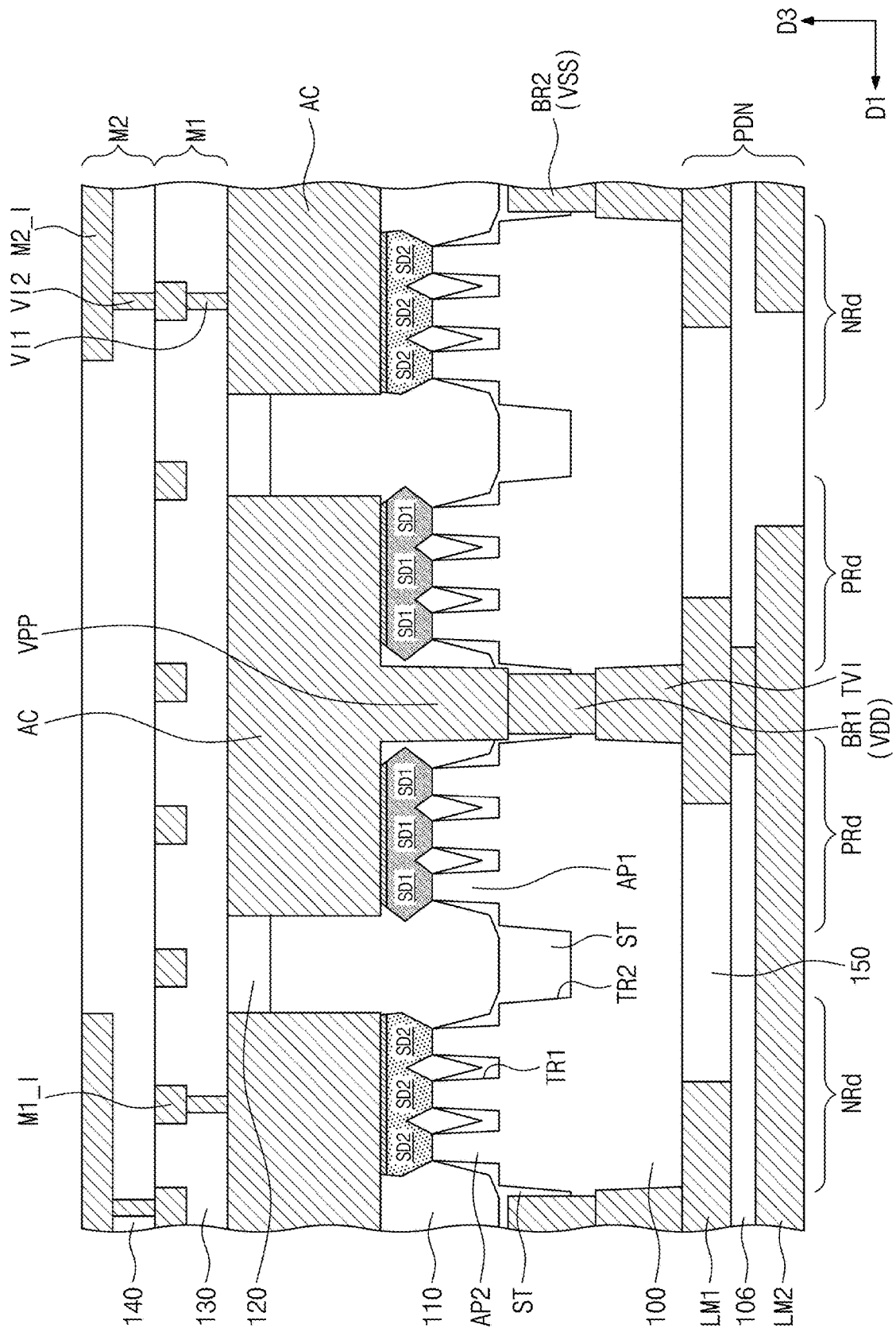

FIG. 29B is a sectional view illustrating a logic cell of a semiconductor device according to an example embodiment. Referring to FIG. 29B, the logic cell LC may include the through vias TVI. The first lower interconnection lines LM1 may be electrically connected to the first and second buried power lines BR1 and BR2, respectively, through the through vias TVI of the logic cell LC.

The active contact AC may include a vertically protruding portion VPP, which is disposed between adjacent ones of the first active regions PR. The vertically protruding portion VPP may be connected to the first buried power line BR1. As a result, the drain voltage VDD from the power delivery network PDN may be applied to the first source/drain patterns SD1 through the through via TVI, the first buried power line BR1, and the vertically protruding portion VPP of the active contact AC.

FIGS. 30A to 30D are sectional views, which are respectively taken along the lines A-A', B-B', C-C', and D-D' of FIG. 5 to illustrate a semiconductor device according to an example embodiment. For concise description, an element previously described with reference to FIGS. 5 and 6A to 6D may be identified by the same reference number without repeating an overlapping description thereof.

Referring to FIGS. 5 and 30A to 30D, the first active region PR and the second active region NR may be provided in the first logic cell LC1. The device isolation layer ST may be provided on the substrate 100. The device isolation layer ST may define the first and second active patterns AP1 and AP2 in an upper portion of the substrate 100. The first and second active patterns AP1 and AP2 may be provided on the first and second active regions PR and NR, respectively.

The first active pattern AP1 may include the first channel patterns CH1, which are vertically stacked. The stacked first channel patterns CH1 may be spaced apart from each other in the third direction D3. The stacked first channel patterns CH1 may be vertically overlapped with each other. The second active pattern AP2 may include the second channel patterns CH2, which are vertically stacked. The stacked second channel patterns CH2 may be spaced apart from each other in the third direction D3. The stacked second channel patterns CH2 may be vertically overlapped with each other. The first and second channel patterns CH1 and CH2 may be formed of or include at least one of silicon (Si), germanium (Ge), or silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect the adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect the adjacent pair of the second source/drain patterns SD2 to each other.

The gate electrodes GE may be provided to cross the first and second channel patterns CH1 and CH2 and to extend in the first direction D1. The gate electrode GE may be vertically overlapped with the first and second channel patterns CH1 and CH2. A pair of the gate spacers GS may be disposed on opposite side surfaces of the gate electrode GE. The gate capping pattern GP may be provided on the gate electrode GE.

Figure 30A:
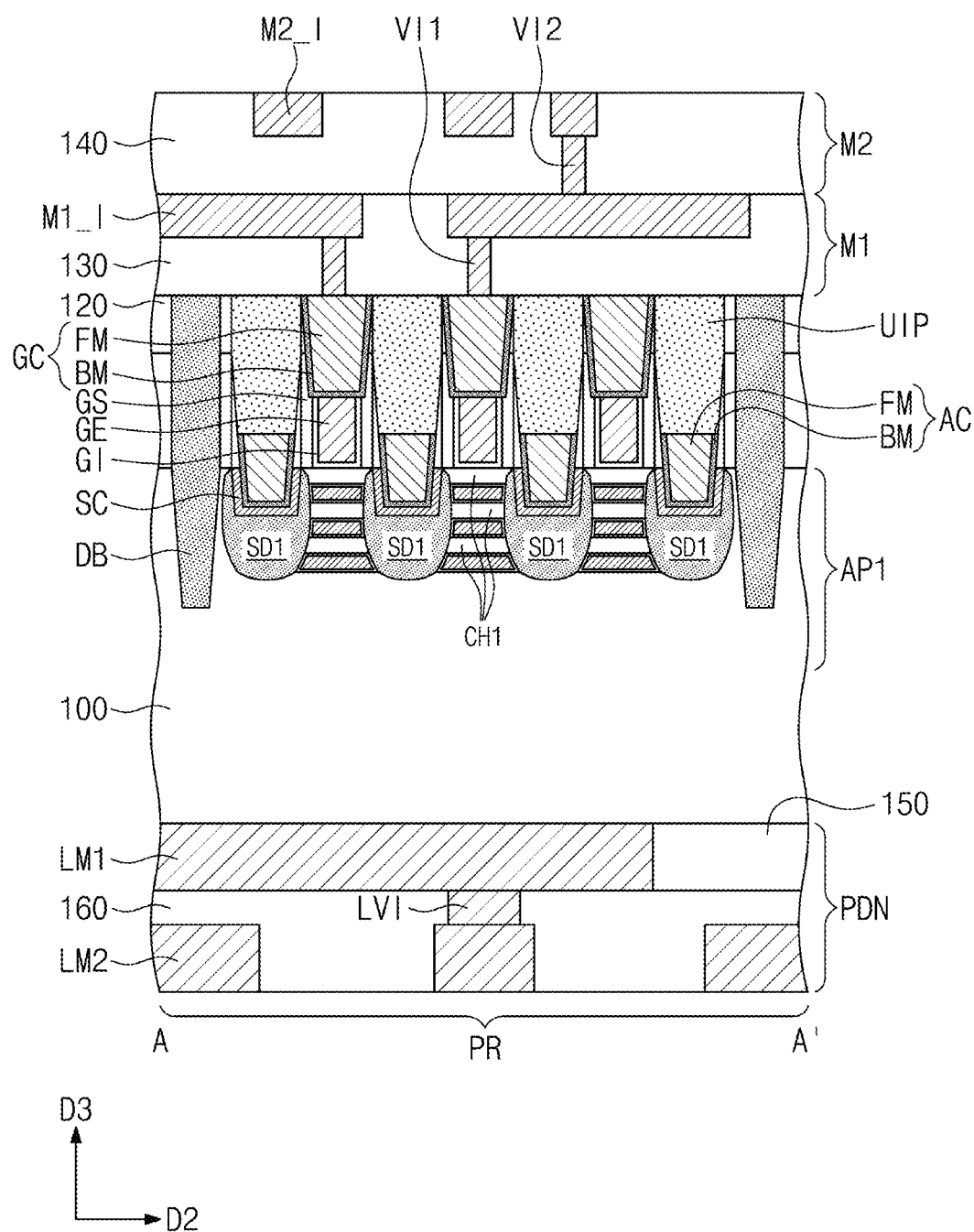
FIGS. 30A, 30B, 30C and 30D are sectional views, which are respectively taken along the lines A-A', B-B', C-C', and D-D' of FIG. 5, illustrating a semiconductor device according to example embodiments.
Figure 30B:
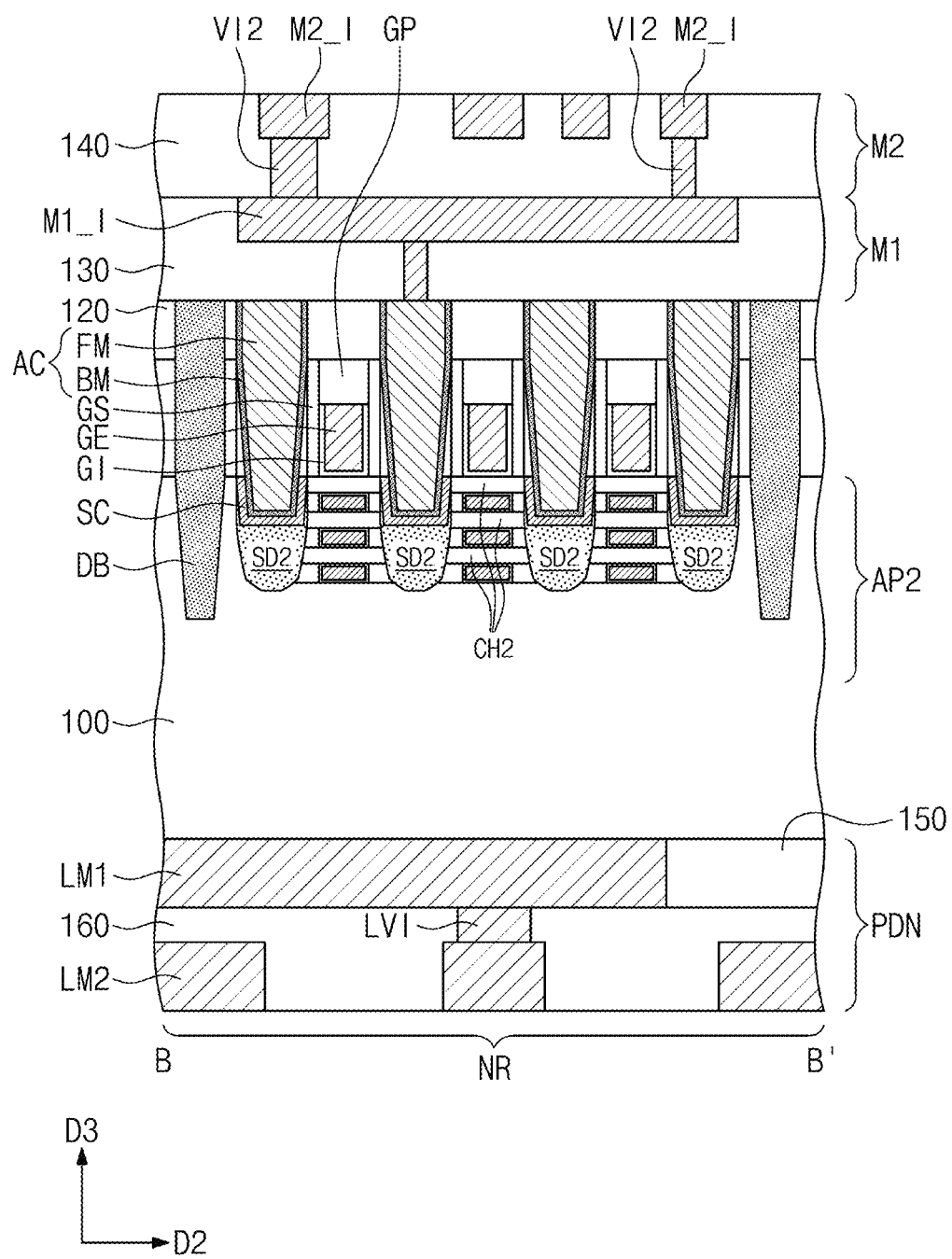
Figure 30C:
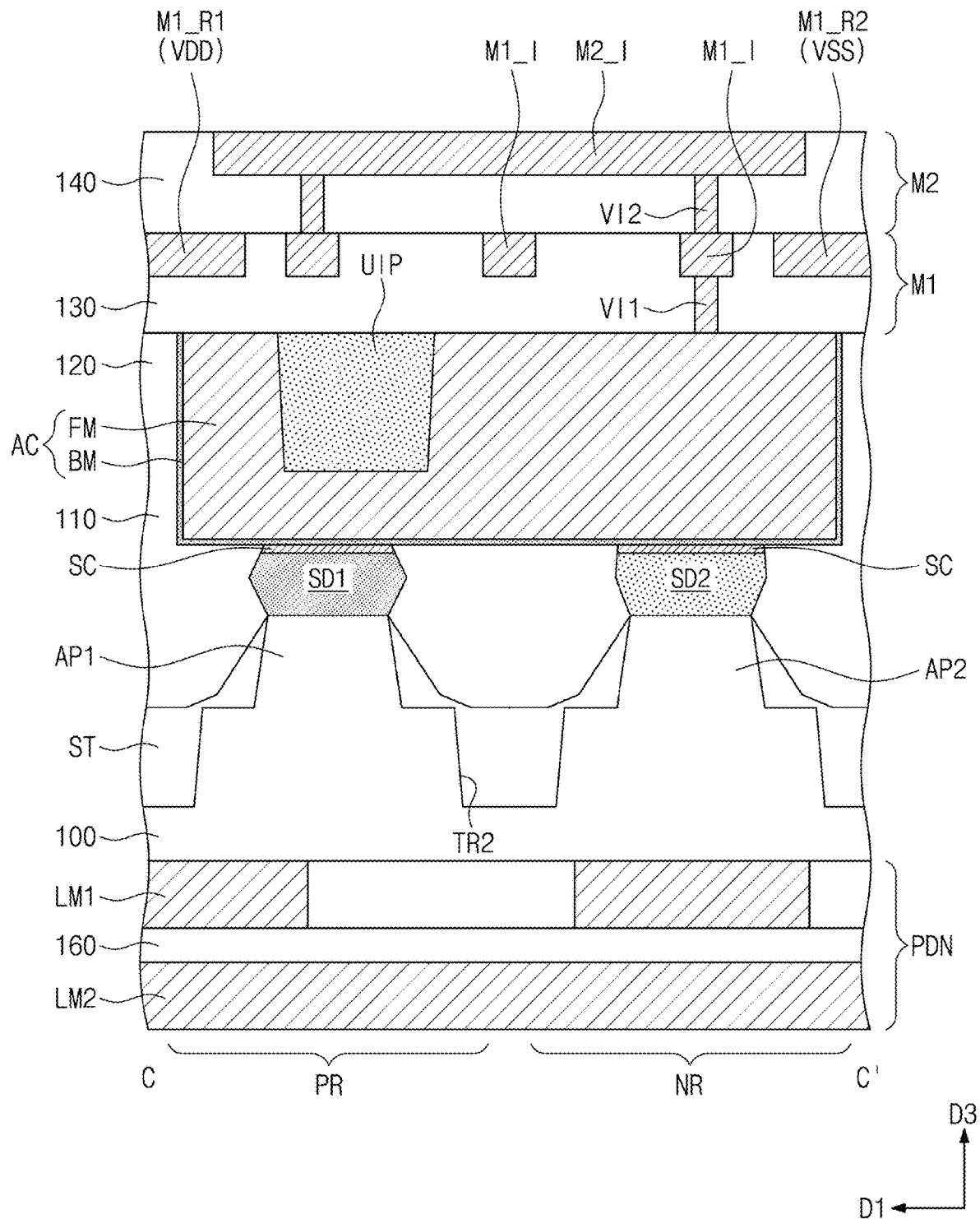
Figure 30D:
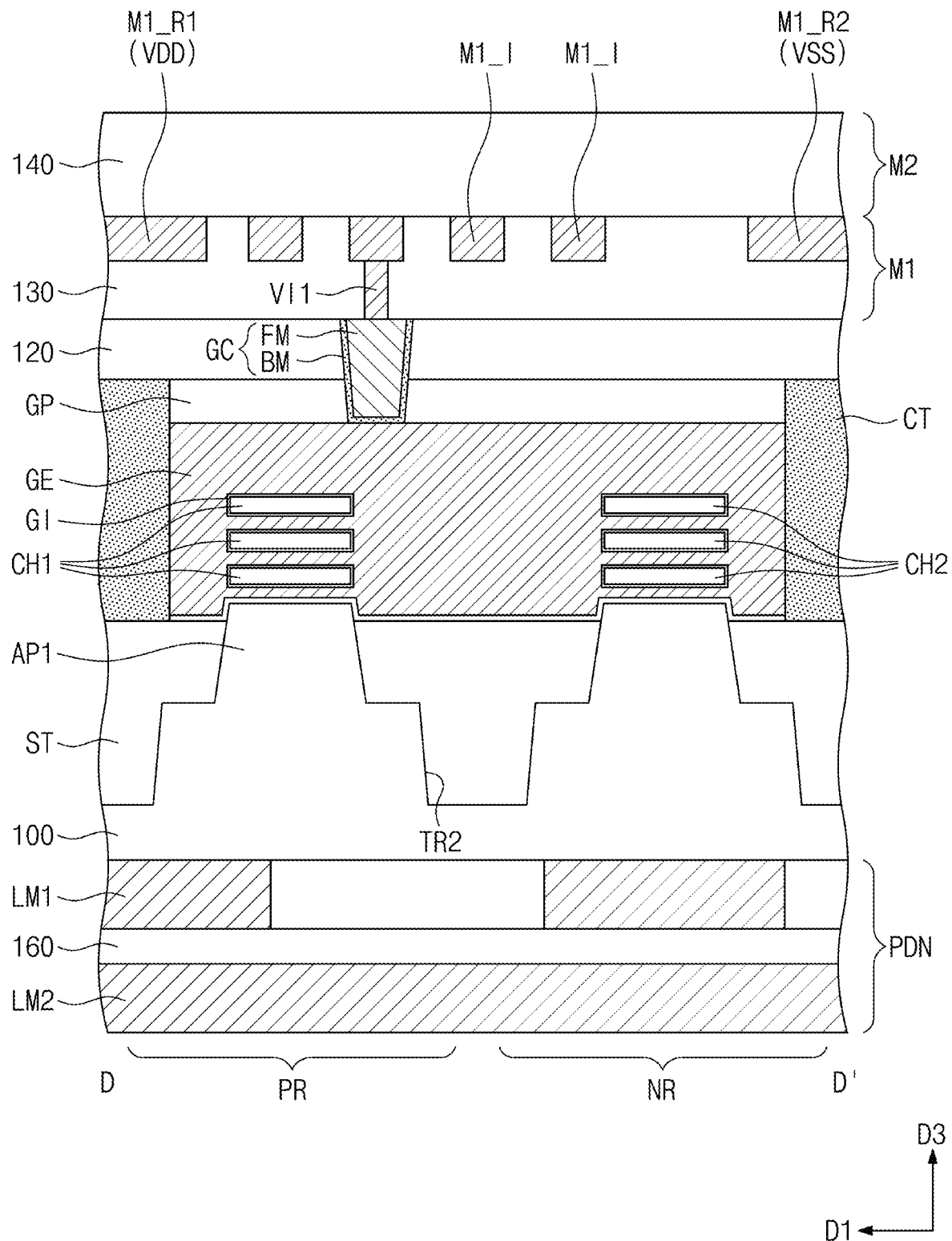

The gate electrode GE may be provided to surround each of the first and second channel patterns CH1 and CH2 (e.g., see FIG. 30D). For example, the gate electrode GE may be provided to face a top surface, a bottom surface, and opposite side surfaces of each of the first and second channel patterns CH1 and CH2. The transistor may be a three-dimensional field effect transistor (e.g., MBCFET or GAAFET) in which the gate electrode GE is provided to three-dimensionally surround the channel pattern CH1 or CH2.

The gate dielectric pattern GI may be provided between the gate electrode GE and each of the first and second channel patterns CH1 and CH2. The gate dielectric pattern GI may enclose each of the first and second channel patterns CH1 and CH2.

An insulating pattern IP may be interposed between the gate dielectric pattern GI and the second source/drain pattern SD2, on the second active region NR. The gate electrode GE may be spaced apart from the second source/drain pattern SD2 by the gate dielectric pattern GI and the insulating pattern IP. In an example embodiment, the insulating pattern IP may be omitted on the first active region PR.

The active contacts AC may penetrate the first and second interlayer insulating layers 110 and 120 on the substrate 100, and be connected to the first and second source/drain patterns SD1 and SD2, respectively. The gate contact GC may penetrate the second interlayer insulating layer 120 and the gate capping pattern GP, and be connected to the gate electrode GE. The first metal layer M1 may be provided in the third interlayer insulating layer 130. The second metal layer M2 may be provided in the fourth interlayer insulating layer 140.

Figure 31:
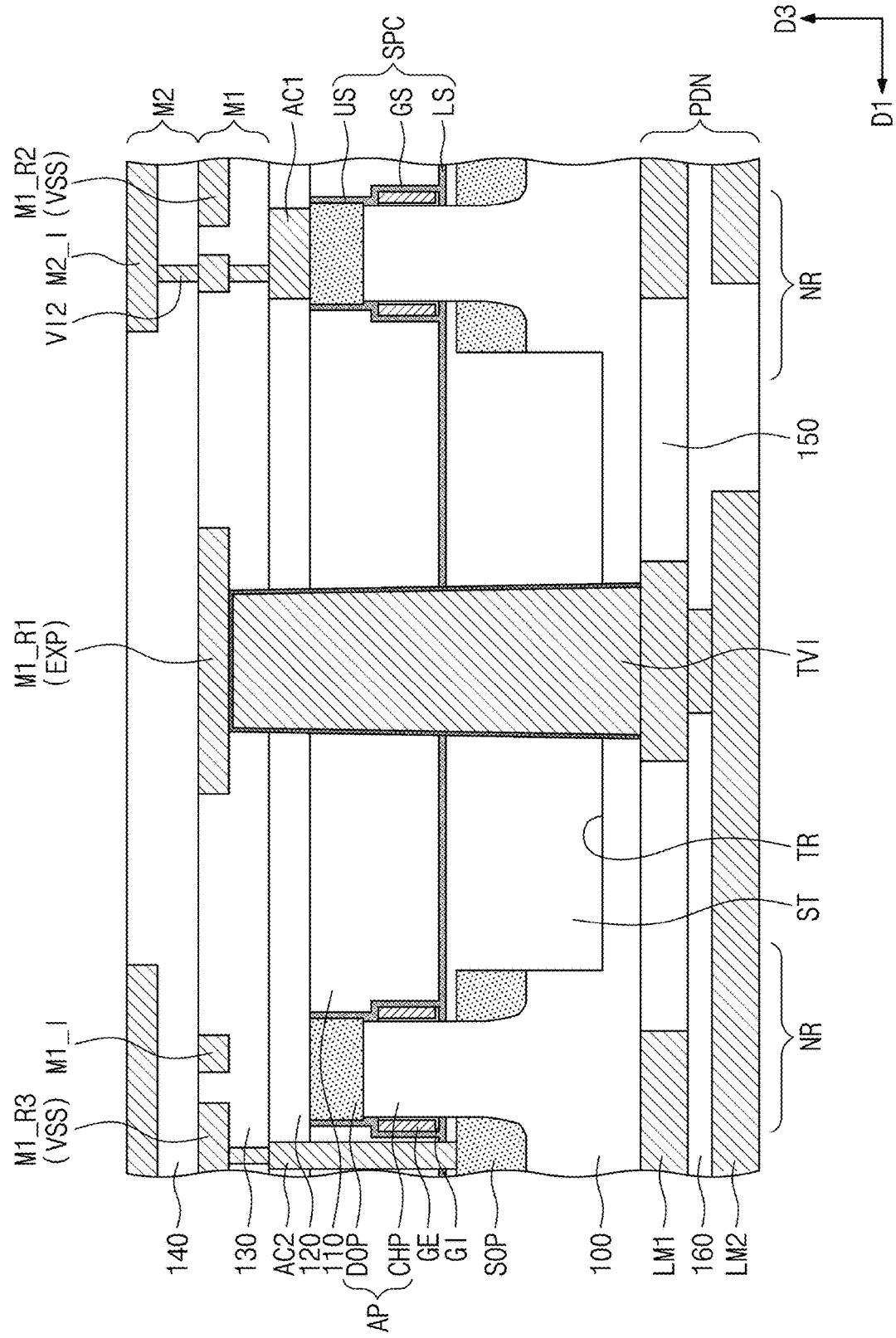
FIG. 31 is a sectional view illustrating a semiconductor device according to an example embodiment.

FIG. 31 is a sectional view illustrating a semiconductor device according to an example embodiment. Referring to FIG. 31, the semiconductor device may include vertical transistors (e.g., Vertical FETs) and interconnection lines, which are used to connect the vertical transistors to each other.

In detail, the substrate 100 may include a first active region and the second active region NR. The active regions may be defined by a trench TR, which is formed in an upper portion of the substrate 100. A lower epitaxial pattern SOP may be provided on the second active region NR. The lower epitaxial pattern SOP may be an epitaxial pattern that is formed by a selective epitaxial growth process. The lower epitaxial pattern SOP may be provided in an upper portion of the substrate 100.

An active pattern AP may be provided on the second active region NR. The active pattern AP may be a vertically protruding fin-shaped pattern. When viewed in a plan view, the active pattern AP may be a bar-shaped pattern extending in the first direction D1. The active pattern AP may include a channel pattern CHP, which vertically protrudes from the lower epitaxial pattern SOP, and an upper epitaxial pattern DOP on the channel pattern CHP.

The device isolation layer ST may be provided on the substrate 100 to fill the trench TR. The device isolation layer ST may cover a top surface of the lower epitaxial pattern SOP. The active pattern AP may protrude above the device isolation layer ST in the vertical direction.

The gate electrode GE may be provided on the device isolation layer ST. The gate electrode GE may be provided to surround the channel pattern CHP of the active pattern AP. The gate dielectric pattern GI may be interposed between the gate electrode GE and the channel pattern CHP. The gate dielectric pattern GI may cover a bottom surface of the gate electrode GE and an inner side surface of the gate electrode GE. For example, the gate dielectric pattern GI may directly cover a side surface of the active pattern AP.

The upper epitaxial pattern DOP may protrude above the gate electrode GE in the vertical direction. The top surface of the gate electrode GE may be lower than the bottom surface of the upper epitaxial pattern DOP. In other words, the active pattern AP may protrude vertically from the substrate 100 and may have a structure penetrating the gate electrode GE.

The semiconductor device may include vertical transistors, in which carriers move in the third direction D3. For example, when the transistor is turned on by a voltage applied to the gate electrode GE, the carriers may move from the lower epitaxial pattern SOP to the upper epitaxial pattern DOP through the channel pattern CHP. The gate electrode GE may be provided to fully surround the side surface of the channel pattern CHP. The transistor may be a three-dimensional field effect transistor (e.g., VFET) having a gate-all-around structure. Because the gate electrode is provided to fully surround the channel pattern, the semiconductor device may have excellent electric characteristics.

A spacer SPC may be provided on the device isolation layer ST to cover the gate electrode GE and the active pattern AP. The spacer SPC may contain a silicon nitride layer or a silicon oxynitride layer. The spacer SPC may include a lower spacer LS, an upper spacer US, and the gate spacer GS between the lower and upper spacers LS and US.

The lower spacer LS may directly cover the top surface of the device isolation layer ST. The gate electrodes GE may be spaced apart from the device isolation layer ST in the third direction D3 by the lower spacer LS. The gate spacer GS may cover the top and outer side surfaces of each of the gate electrodes GE. The upper spacer US may also cover the upper epitaxial pattern DOP. However, the upper spacer US may not cover the top surface of the upper epitaxial pattern DOP, and thus, the top surface of the upper epitaxial pattern DOP may be exposed.

The first interlayer insulating layer 110 may be provided on the spacer SPC. The first interlayer insulating layer 110 may have a top surface that is substantially coplanar with the top surface of the upper epitaxial pattern DOP. The second to fourth interlayer insulating layers 120, 130, and 140 may be sequentially stacked on the first interlayer insulating layer 110. The second interlayer insulating layer 120 may cover the top surfaces of the upper epitaxial patterns DOP.

At least one first active contact AC1 may penetrate the second interlayer insulating layer 120 and be coupled to the upper epitaxial pattern DOP. At least one second active contact AC2 may be provided to sequentially penetrate the second interlayer insulating layer 120, the first interlayer insulating layer 110, the lower spacer LS and the device isolation layer ST, and be coupled to the lower epitaxial pattern SOP. The gate contact GC may be provided to sequentially penetrate the second interlayer insulating layer 120, the first interlayer insulating layer 110 and the gate spacer GS, and be coupled to the gate electrode GE. The first and second active contacts AC1 and AC2 and the gate contact GC may have top surfaces that are substantially coplanar with the top surface of the second interlayer insulating layer 120. The first metal layer M1 may be provided in the third interlayer insulating layer 130. The second metal layer M2 may be provided in the fourth interlayer insulating layer 140.

The power delivery network PDN may be provided on the bottom of the substrate 100. The power delivery network PDN may be connected to the expanded portion EXP of the first power line M1_R1 through the through via TVI.

Figure 32:
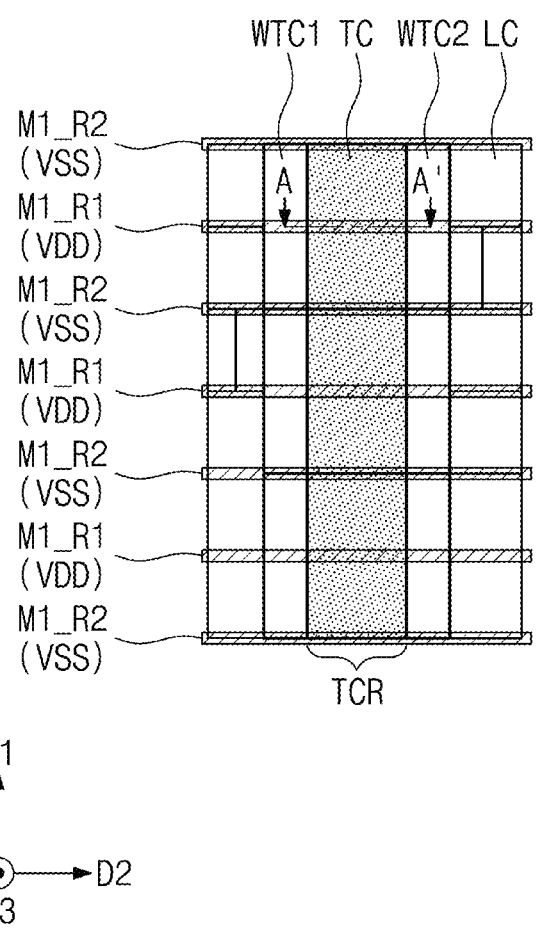
FIG. 32 is a plan view illustrating a semiconductor device according to an example embodiment.
Figure 33:
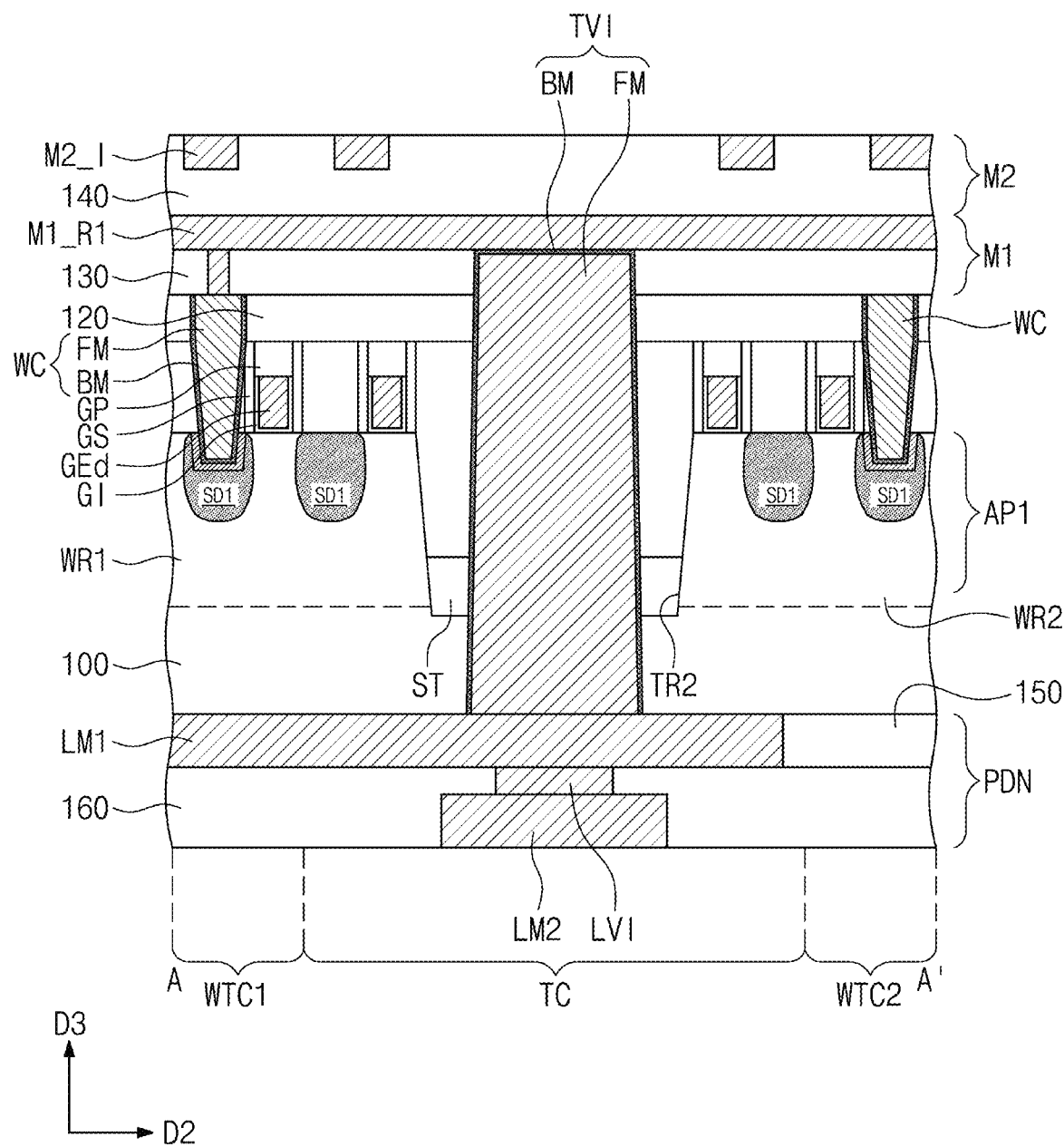
FIG. 33 is a sectional view taken along a line A-A' of FIG. 32 according to an example embodiment.

FIG. 32 is a plan view illustrating a semiconductor device according to an example embodiment. FIG. 33 is a sectional view taken along a line A-A' of FIG. 32.

Referring to FIGS. 32 and 33, the tap cells TC may be disposed on the first and second power lines M1_R1 and M1_R2. The tap cells TC may be arranged in the first direction D1 to constitute a tap cell track TCR. For example, the tap cells TC of the tap cell track TCR of FIG. 32 may be configured to apply a voltage from the power delivery network PDN to the first power lines M1_R1.

The well regions of the logic cells LC, which are provided at a side of the tap cell track TCR, may be separated from the well regions of the logic cells LC, which are provided at an opposite side of the tap cell track TCR, by the tap cell track TCR. In other words, the well regions, which are provided at opposites sides of the tap cell track TCR, may be disconnected from each other by the tap cell track TCR.

To apply a bias voltage to the well regions which are disconnected from each other by the tap cell track TCR, first well tap cells WTC1 may be arranged in the first direction D1, at the side of the tap cell track TCR. Second well tap cells WTC2 may be arranged in the first direction D1, at the opposite side of the tap cell track TCR.

Referring to FIG. 33, each of the first and second well tap cells WTC1 and WTC2 may include at least one well contact WC. In the first well tap cell WTC1, the well contact WC may be used to apply a voltage to a first well region WR1, which is provided at a side of the tap cell TC. In the second well tap cell WTC2, the well contact WC may be used to apply a voltage to a second well region WR2, which is provided at an opposite side of the tap cell TC.

Figure 34:
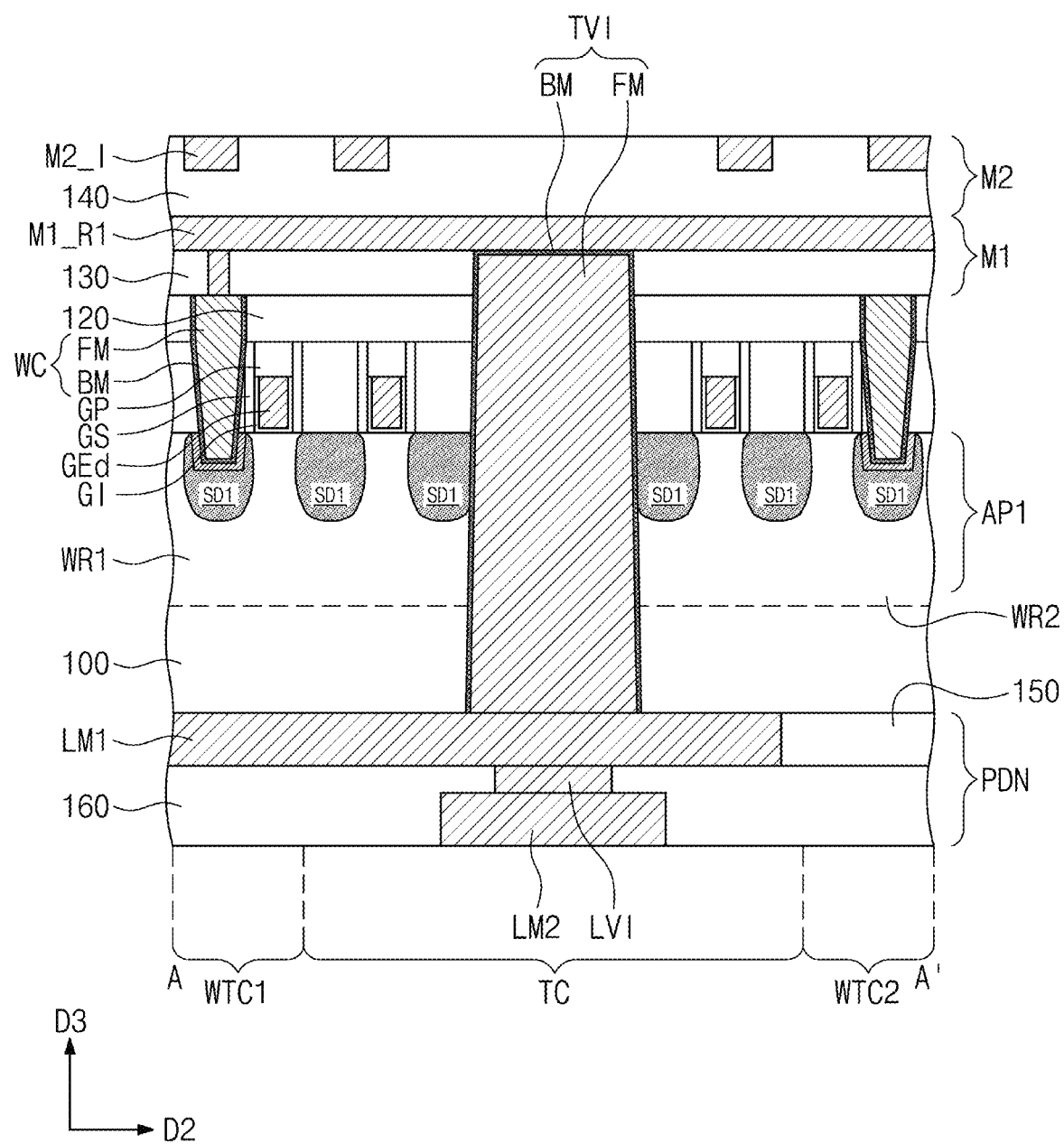
FIG. 34 is a sectional view illustrating another example of a vertical section taken along the line A-A' of FIG. 32 according to an example embodiment.

FIG. 34 is a sectional view illustrating another example of a vertical section taken along the line A-A' of FIG. 32. Referring to FIG. 34, the first and second well tap cells WTC1 and WTC2 may be respectively provided at two opposite sides of the tap cell TC. The tap cell TC may not include the second trench TR2 and the device isolation layer ST filling the second trench TR2.

The through via TVI may penetrate the substrate 100 and be in direct contact with the first and second well regions WR1 and WR2. The through via TVI may also be in direct contact with the first source/drain patterns SD1. As a result, not only the well contact WC but also the through via TVI may be used to apply a voltage to the well region WR1 or WR2. For example, the voltage may be directly applied to the well region WR1 or WR2 through the through via TVI.

In a semiconductor device according to an example embodiment, a power delivery network may be disposed on a bottom surface of a substrate, and thus, it may be possible to increase an integration density of the semiconductor device and to increase a degree of freedom in constructing a routing structure in stacked metal layers. The semiconductor device may further include a tap cell, which is additionally disposed in a cell region provided with logic cells, and thus, it may be possible to stably apply a voltage from the power delivery network to a power line. A dummy region serving as a buffer may be disposed in the tap cell, and this may make it possible to reduce influence of the tap cell on neighboring logic cells. According to an example embodiment, the power line may include an expanded portion, which allows the through via to be stably connected thereto.

While example embodiments have been particularly shown and described, it will be understood by one of ordinary skill in the art that variations in form and detail may be made therein without departing from the spirit and scope of the attached claims.

What is claimed is:

1. A semiconductor device, comprising:
   logic cells and tap cells, which are two-dimensionally arranged on a substrate;
   a first metal layer provided on the logic cells and the tap cells;
   a second metal layer provided on the first metal layer; and
   a power delivery network provided on a bottom surface of the substrate,
   wherein a first logic cell, which is one of the logic cells, comprises:
      a first active region and a second active region;
      a gate electrode provided on the first active region and the second active region;
      an active contact that is adjacent to the gate electrode; and
      a gate contact electrically coupled to the gate electrode,
   wherein a first tap cell, which is one of the tap cells and is adjacent to the first logic cell, comprises:
      a first dummy region that is adjacent to the first active region; a second dummy region that is adjacent to the second active region;
      a dummy electrode provided on the first dummy region and the second dummy region; and
      a through via which vertically extends from the power delivery network through the substrate,
   wherein the first metal layer comprises a first power line and a second power line which extend across the first logic cell and the first tap cell in parallel to each other, and
   wherein the power delivery network and the first power line are electrically connected to each other through the through via in the first tap cell.

2. The semiconductor device of claim 1, wherein the first power line comprises an expanded portion disposed on the first tap cell,
   wherein the through via and the expanded portion vertically overlap, and
   wherein the through via extends from the power delivery network to the expanded portion.

3. The semiconductor device of claim 2, wherein a width of the expanded portion is 3 to 10 times a line width of the first power line.

4. The semiconductor device of claim 2, wherein the gate electrode comprises a plurality of gate electrodes arranged with a uniform pitch on the first active region and the second active region, and
   wherein a width of the expanded portion is 1.5 to 7 times the uniform pitch between the plurality of gate electrodes.

5. The semiconductor device of claim 1, further comprising a spacer provided on a side surface of the through via,
   wherein the spacer comprises a liner, which extends along the side surface of the through via, and a plurality of scallops, which protrude from the liner, and
   wherein a thickness of the liner is 10 to 30 times a largest width of the plurality of scallops.

6. The semiconductor device of claim 1, wherein the first tap cell further comprises a device isolation layer provided in a trench between the first dummy region and the second dummy region, and wherein the through via penetrates through the device isolation layer.

7. The semiconductor device of claim 1, wherein the first tap cell further comprises an expanded contact provided at a same level as the active contact, and
wherein the expanded contact electrically connects the first power line and the through via.

8. The semiconductor device of claim 1, wherein the first metal layer comprises a pad provided on the first tap cell,
wherein the second metal layer comprises an upper power line provided on the first tap cell,
wherein the through via extends from the power delivery network to the pad, and
wherein the upper power line connects the pad to the first power line.

9. The semiconductor device of claim 1, wherein the first tap cell further comprises a well contact connected to the first dummy region, and
wherein the well contact is connected to the first power line.

10. The semiconductor device of claim 1, wherein a first tap cell track and a second tap cell track are defined on the substrate and extend in a first direction,
wherein the second tap cell track is spaced apart from the first tap cell track in a second direction,
wherein the tap cells comprise second tap cells which are arranged along the first tap cell track in the first direction,
wherein the tap cells comprise third tap cells which are arranged along the second tap cell track in the first direction,
wherein the first power line comprises a plurality of first power lines,
wherein the second power line comprises a plurality of second power lines,
wherein each of the second tap cells is configured to electrically connect the power delivery network to a corresponding one of the plurality of first power lines, and
wherein each of the third tap cells is configured to electrically connect the power delivery network to a corresponding one of the plurality of second power lines.

* * * * *